(12) United States Patent
Kaetsu et al.

(10) Patent No.: US 6,643,141 B2
(45) Date of Patent: Nov. 4, 2003

(54) TRANSMISSION APPARATUS, SUBRACK AND CONNECTOR UNIT

(75) Inventors: Mitsuo Kaetsu, Kawasaki (JP); Kazumasa Yoshito, Kawasaki (JP); Takashi Inoue, Kawasaki (JP); Tsutomu Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 09/897,334

(22) Filed: Jul. 2, 2001

(65) Prior Publication Data

US 2002/0101725 A1 Aug. 1, 2002

(30) Foreign Application Priority Data

Jan. 31, 2001 (JP) ........................................ 2001-022631

(51) Int. Cl.⁷ ............................. H05K 7/18; H05K 05/00
(52) U.S. Cl. ...................... 361/797; 361/796; 361/800; 361/788; 361/752; 174/255
(58) Field of Search ................................ 439/64, 65, 66, 439/67, 74, 76, 1, 76.2, 80–82; 361/784–785, 796–797, 798, 800–804, 683, 752, 756, 788; 174/255, 260, 52.1; 312/223.2

(56) References Cited

U.S. PATENT DOCUMENTS

| 5,023,754 A | * | 6/1991 | Aug | ............................ 361/800 |
| 6,241,530 B1 | * | 6/2001 | Eddy | ............................ 439/61 |
| 6,323,423 B1 | * | 11/2001 | Tirrell | ........................ 174/52.1 |

FOREIGN PATENT DOCUMENTS

WO      WO 00/74454 A1      12/2000

* cited by examiner

*Primary Examiner*—David Martin
*Assistant Examiner*—Michael L. Lindinger
(74) *Attorney, Agent, or Firm*—Katten Muchin Zavis Roseman

(57) ABSTRACT

A transmission apparatus which is capable of maintaining excellent EMC performances even if the number of cables to be connected thereto is increased. An electronic circuit unit is plugged into a subrack from the front of the subrack. A connector unit-receiving block is arranged on the rear surface of the subrack. A connector unit connectable with an external cable to be connected to the electronic circuit unit is plugged into the rear of the subrack at the rear of the electronic circuit unit, for being received within the connector unit-receiving block. The connector unit is configured such that a metal shield case covers a connector board having a connector mounted thereon.

11 Claims, 34 Drawing Sheets

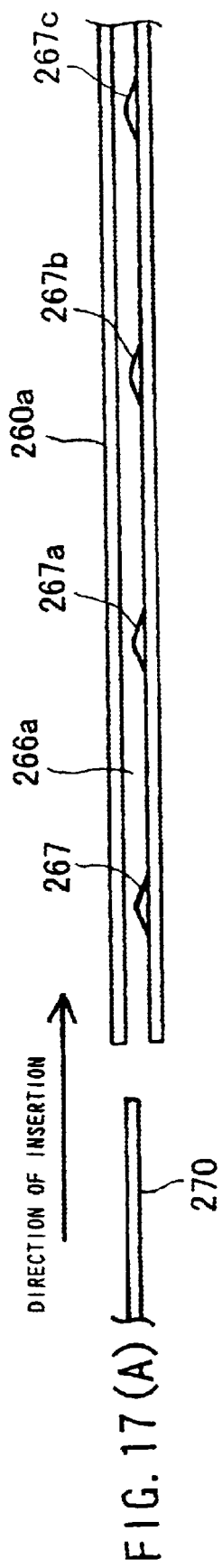
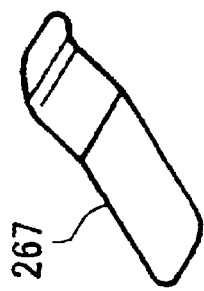
FIG. 17 (A)
FIG. 17 (B)

TRANSMISSION APPARATUS, SUBRACK AND CONNECTOR UNIT

BACKGROUND OF THE INVENTION

1. Field of the Invention

The present invention relates to a transmission apparatus, a subrack, and a connector unit, and more particularly to a transmission apparatus, a subrack, and a connector unit each having a shield structure for enhancing EMC (Electro Magnetic Compatibility) performance thereof.

2. Description of the Related Art

Recent transmission apparatuses can be equipped with ATM (Asynchronous Transfer Mode)/LAN (Local Area Network) functions in addition to the existing SONET (Synchronous Optical Network)/SDH (Synchronous Digital Hierarchy) systems. In this case, a plurality of transmission lines are cross-connected via the transmission apparatus.

FIG. 34 shows the appearance of a conventional transmission apparatus. The conventional transmission apparatus 900 has a shield rack 910 housing a subrack 920. The shield rack 910 has a door 911 attached to the front face thereof for opening and closing the shield rack 910. Further, the shield rack 910 has an upper wall thereof formed with openings 912, 913 for receiving cables therethrough.

The subrack 920 also has a door 922 attached to the front face thereof for opening and closing the subrack 920. The subrack 920 houses a plurality of electronic circuit units 921 to which are connected various cables inserted through the openings 912, 913 from the outside of the shield rack 910. The cables connected to the plurality of electronic circuit units 921 include metallic cables 931, 932 and optical fiber cables 933, 934.

In the transmission apparatus 900 constructed as above, the shield rack 910 shields the plurality of internal electronic circuit units 921 and the various cables received therein from external electromagnetic waves, for improvement of EMC performance of the electronic circuit units 921 and the cables.

In recent years, with improvement of processing capabilities, the number of cables to be connected to electronic circuit units in a transmission apparatus tend to be increased. Therefore, the conventional transmission apparatus 900 is required to have the openings 912, 913 increased in open area so as to receive an increased number of cables.

However, if the openings 912, 913 are increased in open area, it can cause degradation of the EMC. In addition, recently, electronic circuit units tends to have higher operating frequencies, and hence there are more exacting demands for EMC performance of such units.

SUMMARY OF THE INVENTION

It is an object of the invention to provide a transmission apparatus, a subrack, and a connector unit which are capable of maintaining excellent EMC performance even if an increased number of cables are connected thereto.

To attain the above object, according to a first aspect of the invention, there is provided a transmission apparatus including a plurality of communication interfaces. The transmission apparatus comprises a subrack including a back wiring board, a first connector arranged on a front surface of the back wiring board, and a second connector arranged on a rear surface of the back wiring board and electrically connected to the first connector, an electronic circuit unit connected to the first connector on the back wiring board, and a connector unit including a connector board on which are mounted a male seat connector connected to the second connector on the back wiring board and an external line connector electrically connected to the male seat connector, and a metal case for covering the connector board.

To attain the above object, according to a second aspect of the invention, there is provided a subrack that is capable of housing a plurality of communication interfaces. The subrack comprises a back wiring board, an electronic circuit unit-receiving block arranged on a front surface of the back wiring board, for receiving an electronic circuit unit, a first connector provided in the electronic circuit unit-receiving block, for connection with the electronic circuit unit, a connector unit-receiving block arranged on a rear surface of the back wiring board, for receiving a connector unit including a connector board on which are mounted a male seat connector and an external line connector electrically connected to the male seat connector, and a metal case for covering the connector board, and a second connector provided in the connector unit-receiving block, for electrical connection with the first connector and connectable with the male seat connector of the connector board.

To attain the above object, according to a third aspect of the invention, there is provided a connector unit for electrically connecting between an electronic circuit unit having a communication interface function and an external cable. The connector unit comprises a connector board on which are mounted a male seat connector connectable to a connector provided in a subrack which is capable of housing the electronic circuit board, and an external line connector electrically connected to the male seat connector, and a metal case for covering the connector board.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 7(A) to 7(E) are views schematically showing steps of assembling a seat connector, in which:

FIG. 7(A) shows a step of mounting a first seat connector to a BWB;

FIG. 7(B) shows a step of mounting a spacer;

FIG. 7(C) shows a step of mounting a shroud;

FIG. 7(D) shows a state of the seat connector having been assembled; and

FIG. 7(E) shows how the electronic circuit board and the connector board are plugged in;

FIGS. 14(A) to 14(C) are views showing the relationship between a shield case and the connector board connected to each other, in which:

FIG. 14(A) is a side view of the connector board;

FIG. 14(B) is a sectional view taken on line A—A of FIG. 14(A); and

FIG. 14(C) is a sectional view taken on line B—B of FIG. 14(A);

FIGS. 17(A) and 17(B) are views showing a shield structure in a groove portion of a shield case body, in which:

FIG. 17(A) shows a spring structure provided in the groove portion of the shield case body; and FIG. 17(B) shows the shape of a spring provided in the groove portion of the shield case body;

FIGS. 18(A) and 18(B) are views showing a shield structure for a front panel of the shield case body, in which:

FIG. 18(A) is a sectional view taken on line C—C of FIG. 16; and

FIG. 18(B) shows the shape of a spring attached to the front panel;

FIGS. 25(A) and 25(B) are enlarged views of a third-to-fourth order-group interface external line connector, in which:

FIG. 25(A) is a top view; and

FIG. 25(B) is a side view;

DESCRIPTION OF THE PREFERRED EMBODIMENTS

Preferred embodiments of the present invention will now be described below with reference to accompanying drawings.

Figure 1:
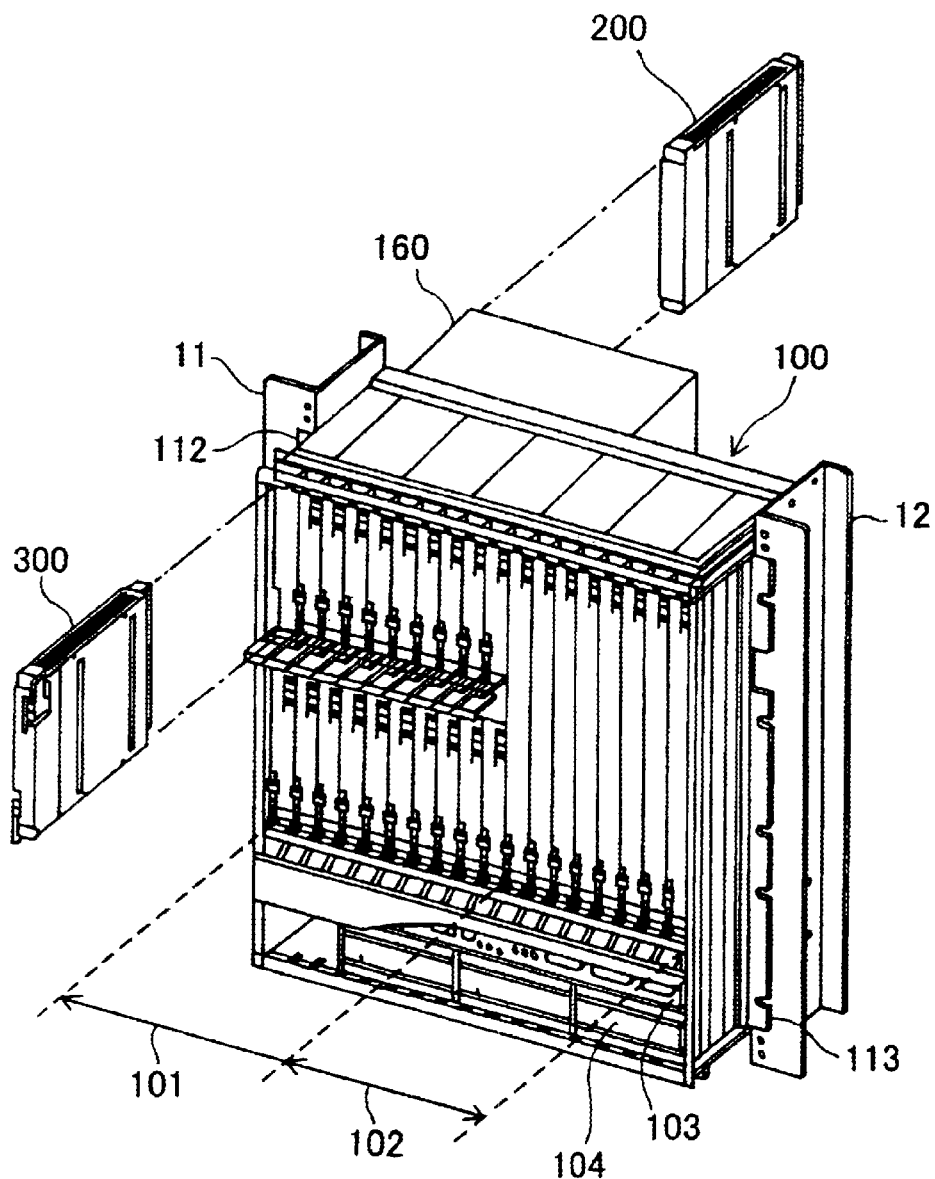
FIG. 1 is a view showing the appearance of a subrack for a transmission apparatus according to an embodiment of the invention.

FIG. 1 shows the appearance of a subrack of a transmission apparatus according to an embodiment of the present invention. In the embodiment, a subrack 100 is fixedly secured to support columns 11, 12 of a main rack via mounting ribs 112, 113. The subrack 100 has a plurality of slots formed in the front thereof, for plugging-in (connection of connectors) of electronic circuit units 300. Each slot can receive an electronic circuit unit 300 therein. The electronic circuit unit 300 is formed by mounting one of various kinds of electronic circuit boards in a box-shaped metal member.

The slots formed in the front of the subrack 100 are grouped into two sections, i.e. a customer interface section 101 and a cross-connect supervisory control section 102. The customer interface section 101 allows a desired kind of electronic circuit unit to be plugged therein. For example, electronic circuit units 300 having a communication interface function customized according to a user's request are plugged into the customer interface section 101. Each electronic circuit unit 300 for a customer interface is selected in accordance with a bit rate required by the user.

The cross-connect supervisory control section 102 have electronic circuit units plugged in, such as a control unit for controlling the whole transmission apparatus, and a supervisory unit for managing transmission of data and signals. An electronic circuit unit 300 for controlling cross-connection of transmission signals is also included in the electronic circuit units plugged in the cross-connect supervisory control section 102.

Below the slots for receiving electronic circuit units, there is arranged a common operating panel 103 provided with buttons and the like for operating the control unit and the like. The common operating panel 103 is also capable of indicating monitored power supply, an alarm, status, etc. Below the common operating panel 103, there are arranged a plurality of fans 104 for sending air into a cabinet of the subrack 100 to forcibly cool the electronic circuit units 300 and other portions which generate heat.

The subrack 100 has a rear face on which a connector unit-receiving block 160 is mounted. The connector unit-receiving block 160 has a box shape in appearance and a shelf structure inside. The connector unit-receiving block 160 is formed with slots for plugging-in of connector units 200. Each connector unit 200 is formed by mounting a connector board in a box-shaped metal member. The connector board is a circuit board for connecting between an external cable connected to the subrack 100 from outside and an electronic circuit unit mounted in the subrack 100.

As described above, the subrack 100 of the present embodiment is configured such that electronic circuit units 300 are plugged into the front of the subrack 100, and connector units 200 are plugged into the rear of the same. The subrack 100 configured as above provides EMC protection for each connector unit 200 and electronic circuit unit 300. Further, in the subrack 100, ECM protection can be provided for each portion of the connector unit-receiving block 160 where a connector unit 200 and the subrack 100 are connected as well as for each portion of the same where a connector unit 200 and an corresponding external cable are connected.

In the following, an example of the subrack 100 configured to provide EMC protection by the whole subrack will be described in detail. First, description is made of a shield structure of a portion where a connector unit 200 is plugged into the subrack 100.

Figure 2:
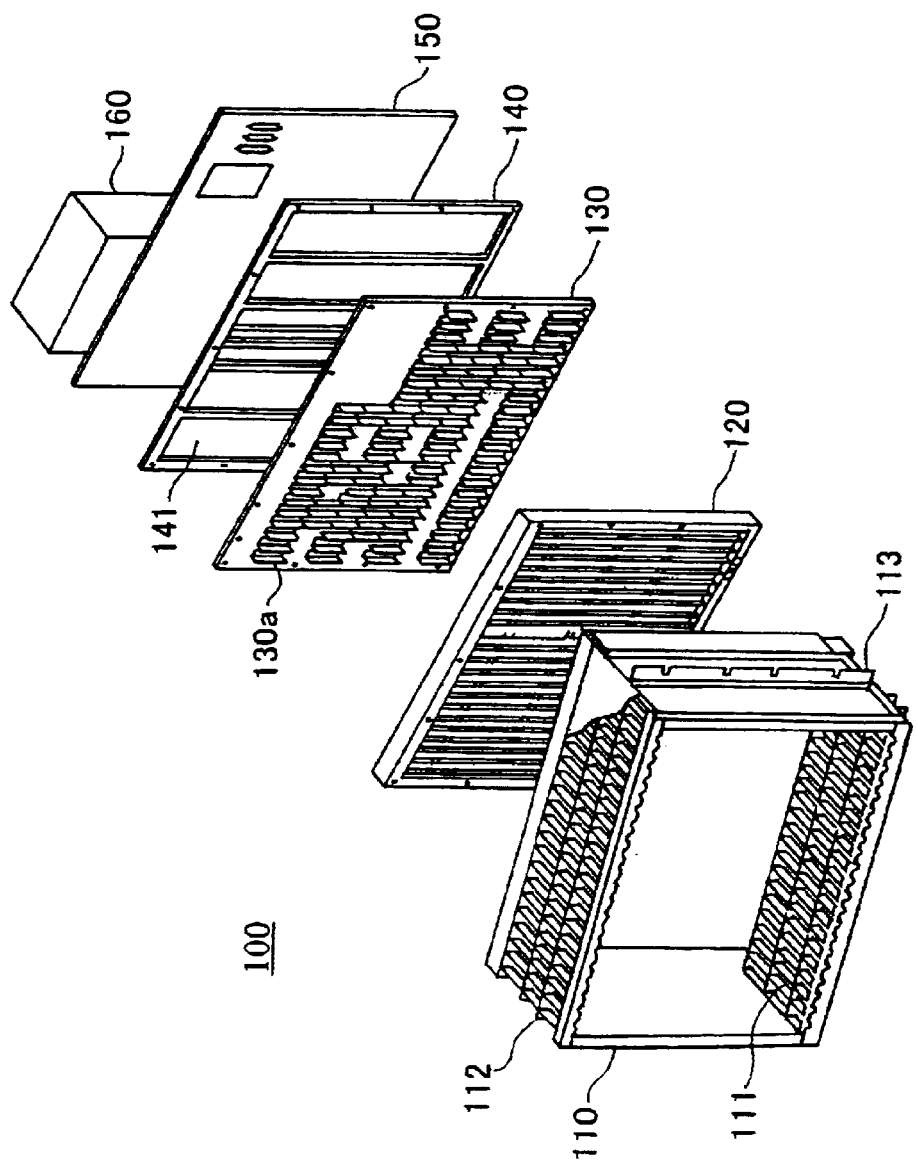
FIG. 2 is an exploded perspective view of the subrack.

FIG. 2 is an exploded perspective view of the subrack. The figure shows only a plug-in mechanism of the subrack 100, for connection between electronic circuit units and connector units. As shown in the figure, the subrack 100 is comprised of an electronic circuit unit-receiving block 110, a metal shield box 120, a back wiring board (BWB) 130, a metal plate 140, a rear panel 150, and the connector unit-receiving block 160, which are arranged in the mentioned order from the front of the subrack 100.

The electronic circuit unit-receiving block 110 has a box shape in appearance and a shelf structure inside. The electronic circuit unit-receiving block 110 is formed with a plurality of slots each for receiving an electronic circuit unit. Further, the electronic circuit unit-receiving block 110 has upper and lower inner walls thereof formed with guide rails 111 each serving as a guide for plugging-in of an electronic circuit unit. Mounting ribs 112, 113 are fixedly attached to opposite outer side walls of the electronic circuit unit-receiving block 110.

The shield box 120 is formed with a plurality of openings each of which is large enough for an electronic circuit unit to be inserted through. The openings of the shield box 120 are separated from each other by ribs (vertical pillar members).

In the front surface of the BWB 130, there are arranged a plurality of first seat connectors 130a into each of which an electronic circuit unit is plugged, while in the rear surface of the BWB 130, there are arranged a plurality of second seat connectors into each of which a connector unit is plugged.

The metal plate 140 is formed with openings 141. The openings 141 are formed at locations corresponding to respective ones of the second seat connectors arranged on the rear surface of the BWB 130. The rear panel 150 is a member on which the connector unit-receiving block 160 is mounted. The rear panel 150 has holes formed at locations corresponding to respective ones of the seat connectors on the BWB 130. The fitting face of each second seat connector is exposed through a corresponding one of the holes formed in the rear panel 150.

The connector unit-receiving block 160 is formed by a box-shaped metal member which can accommodate a plurality of connector units. Details of the construction of the connector unit-receiving block 160 will be described hereinafter.

Figure 3:
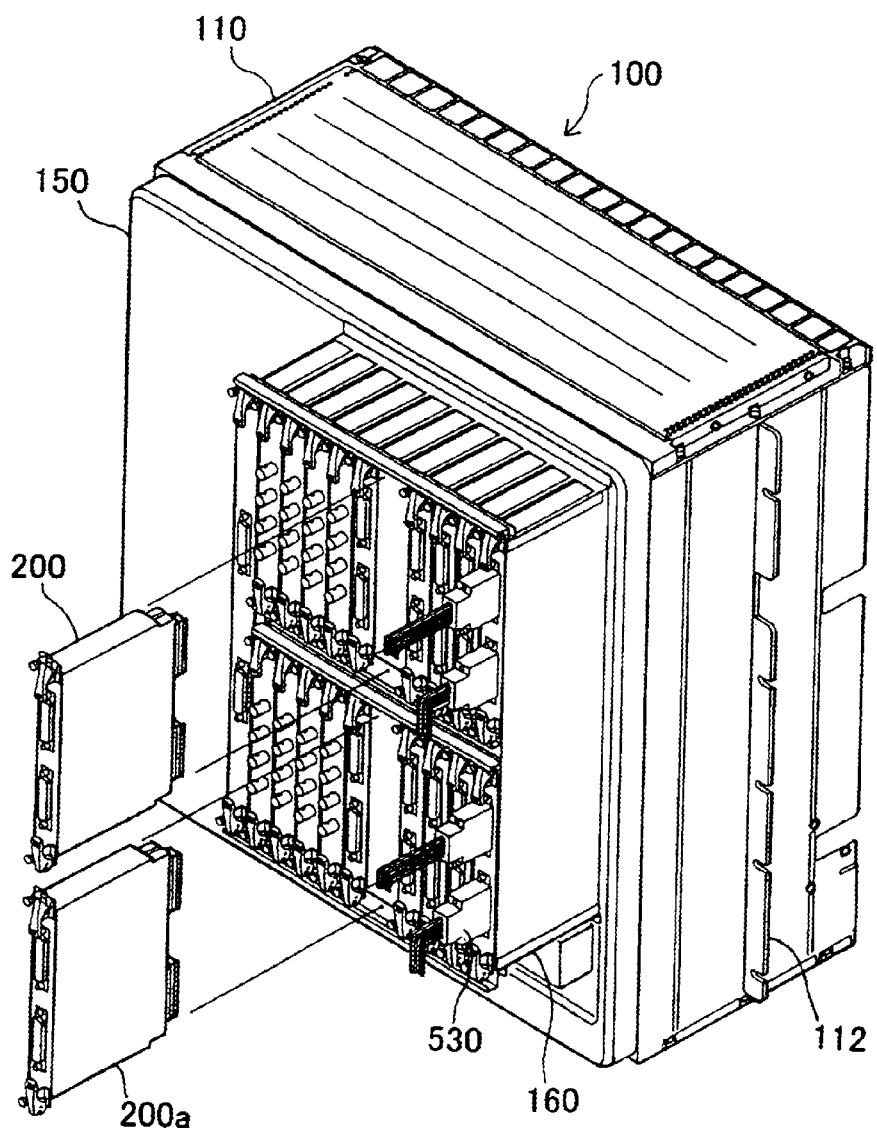
FIG. 3 shows the appearance of the subrack as viewed from the rear side thereof.

FIG. 3 shows the appearance of the subrack as viewed from the rear side thereof. The connector unit-receiving block 160 fixedly mounted on the rear surface of the subrack 100 accommodates a plurality of connector units 200, 200a. Each slot formed in the connector unit-receiving block 160 receives a connector unit or a blank unit identical in shape to the connector unit. As a result, the whole inner space within the connector unit-receiving block 160 is divided into spaces enclosed by metal, which provides a shielding effect against electromagnetic interference.

The connector units 200, 200a received in the connector unit-receiving block 160 are each plugged into a corresponding one of the second seat connectors arranged on the BWB 130. Further, external cables 530 are connected to each of the connector units 200, 200a received in the connector unit-receiving block 160.

As shown in FIGS. 2 and 3, the connector units are received in the connector unit-receiving block 160, whereby EMC protection is provided for each portion where a connector unit is connected to the BWB 130. Similarly, the electronic circuit units are received in the box-shaped electronic circuit unit-receiving block 110, whereby EMC protection is provided for each portion where an electronic circuit unit is connected to the BWB 130.

Next, an example of the construction of the connector unit-receiving block 160 will be described in detail.

Figure 4:
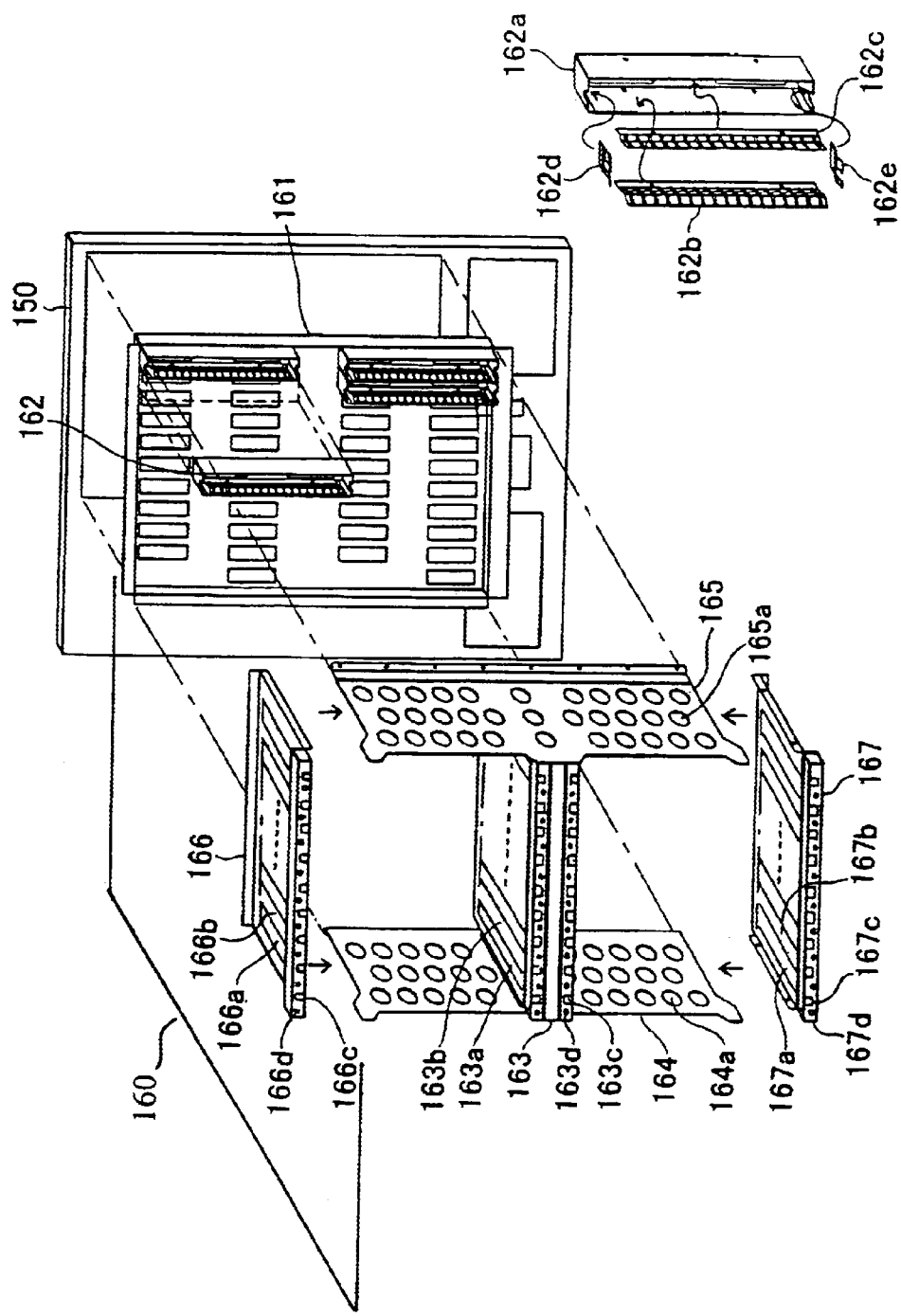
FIG. 4 is an exploded perspective view of a connector unit-receiving block.

FIG. 4 is an exploded perspective view of the connector unit-receiving block. The connector unit-receiving block 160 is comprised of a shield box-mounting panel 161, a plurality of shield boxes 162, an intermediate plate 163, a pair of side plates 164, 165, a top plate 166, and a bottom plate 167.

The shield box-mounting panel 161 is fixed to the rear panel 150 and has the plurality of shield boxes 162 mounted thereon. The shield box-mounting panel 161 has holes formed at locations corresponding to respective ones of the seat connectors on the BWB 130. Each seat connector on the BWB 130 is exposed through a corresponding one of the holes formed through the shield box-mounting panel 161.

Each shield box 162 is a box-shaped metal member for maintaining electromagnetic shielding of each portion where a connector unit received therein is connected to the BWB 130. The shield box 162 serves as a metal shield, and is mounted in each slot of the connector unit-receiving block 160 in a manner enclosing the associated seat connector on the BWB 130.

The shield box 162 is comprised of a metal frame 162a forming the shield, a pair of side surface-pressing springs 162b, 162c, an upper surface-pressing spring 162d, and a lower surface-pressing spring 162e. The metal frame 162a is a hollow metal member having openings in its front and rear, respectively. The pair of side surface-pressing springs 162b, 162c, the upper surface-pressing spring 162d and the lower surface-pressing spring 162e are attached to the respective inner surfaces of the metal frame 162a. The side surface-pressing spring 162b is attached to the left-side inner surface of the metal frame 162a, while the side surface-pressing spring 162c is attached to the right-side inner surface of the same. The upper surface-pressing spring 162d and the lower surface-pressing spring 162e are attached to the respective upper and lower inner surfaces of the metal frame 162a.

The pair of lateral side surface-pressing springs 162b, 162c, the upper surface-pressing spring 162d and the lower surface-pressing spring 162e are each formed of a metal and each have a protrusion protruding inward from the metal frame 162a. The four springs 162b, 162c, 162d, 162e each have a resilient property, and when the protrusions are pressed from the inside of the metal frame 162a, resilient forces acting in a direction against the pressing forces (i.e. forces each acting inward) are generated. The resilient forces cause the side surface-pressing springs 162b, 162c, the upper surface-pressing spring 162d and the lower surface-pressing spring 162e to press a connector unit received in the connector unit-receiving block 160, whereby firm and intimate electrical contact between the connector unit and the connector unit-receiving block 160 is maintained. Further, the springs each have slits formed therein at predetermined space intervals so as to make the electrical contact uniform.

The intermediate plate 163 is formed with a plurality of ventilating slots 163a each having a narrow rectangular shape and extending in a direction of insertion of a connector unit. The ventilating slots 163a are separated by guide rails 163b each for supporting and guiding a connector board. The intermediate plate 163 is placed in a generally horizontal position and has left-side and right-side ends thereof, as viewed in the figure, secured to the respective side plates 164, 165. The left-side and right-side ends of the intermediate plate 163 are fixed to vertically central portions of the respective side plates 164, 165 which are mounted generally perpendicularly to the intermediate plate 163. The side plates 164, 165 are each formed with a plurality of ventilating holes 164a, 165a each having a circular or elliptical shape. The side plate 164 is fixedly secured to the left end of the shield box-mounting panel 161, while the side plate 165 is fixedly secured to the right end of the same.

The top plate 166 is mounted to the upper ends of the respective side plates 164, 165, in parallel with the intermediate plate 163. Similarly to the intermediate plate 163, the top plate 166 is formed with a plurality of ventilating slots 166a each having a narrow rectangular shape and extending in the direction of insertion of a connector unit. The ventilating slots 166a are separated by guide rails 166b each for supporting and guiding a connector board. The top plate 166 is fixedly secured to the upper end of the shield box-mounting panel 161.

The bottom plate 167 is mounted to the lower ends of the respective side plates 164, 165, in parallel with the intermediate plate 163. Similarly to the intermediate plate 163, the bottom plate 167 is formed with a plurality of ventilating slots 167a each having a narrow rectangular shape and extending in the direction of insertion of a connector unit. The ventilating slots 167a are separated by guide rails 167b each for supporting and guiding a connector board. The bottom plate 167 is fixedly secured to the lower end of the shield box-mounting panel 161.

The intermediate plate 163, the top plate 166, and the bottom plate 167 have insertion ends (front end faces) thereof formed with slits 163c, 166c, 167c, respectively, for engagement with insertion levers each required for insertion and withdrawal of a seat connector. Further, the insertion ends of the plates 163, 166, 167 are formed with screw holes 163d, 166d, 167d, respectively, into each of which is screwed a screw for fixing a connector unit.

The connector board in each connector unit received in the connector unit-receiving block 160 is connected to an electronic circuit board in a corresponding one of the electronic circuit units via the BWB 130.

The connector unit-receiving block 160 is thus covered by the metal plates, so that connector boards received in the connector unit-receiving block 160 become proof against external electromagnetic waves. Further, since the plates forming the outer frame of the connector unit-receiving block 160 are each formed with the ventilating openings, it is possible to pass air currents through the connector unit-receiving block 160 and let heat from the connector boards dissipate from the connector unit-receiving block 160. Furthermore, since the metal springs are attached to the inner surfaces of each shield box 162, electrical conductivity between each connector unit containing a connector board and the connector unit-receiving block 160 can be ensured, which makes it possible to provide a shielding effect against electromagnetic interference for an portion where the connector board is connected to the subrack 100.

Further, when a connector unit is plugged in, the connector unit is inserted into one of the slots formed in the connector unit-receiving block 160 and guided by a corresponding one of the guide rails 163b formed on the intermediate plate 163 and a corresponding one of the guide rails 166b or 167b formed on the top or bottom plate 166 or 167 to a proper position in the slot.

In the following, description will be made of the correspondence of connected components between an electronic circuit board and a connector board.

Figure 5:
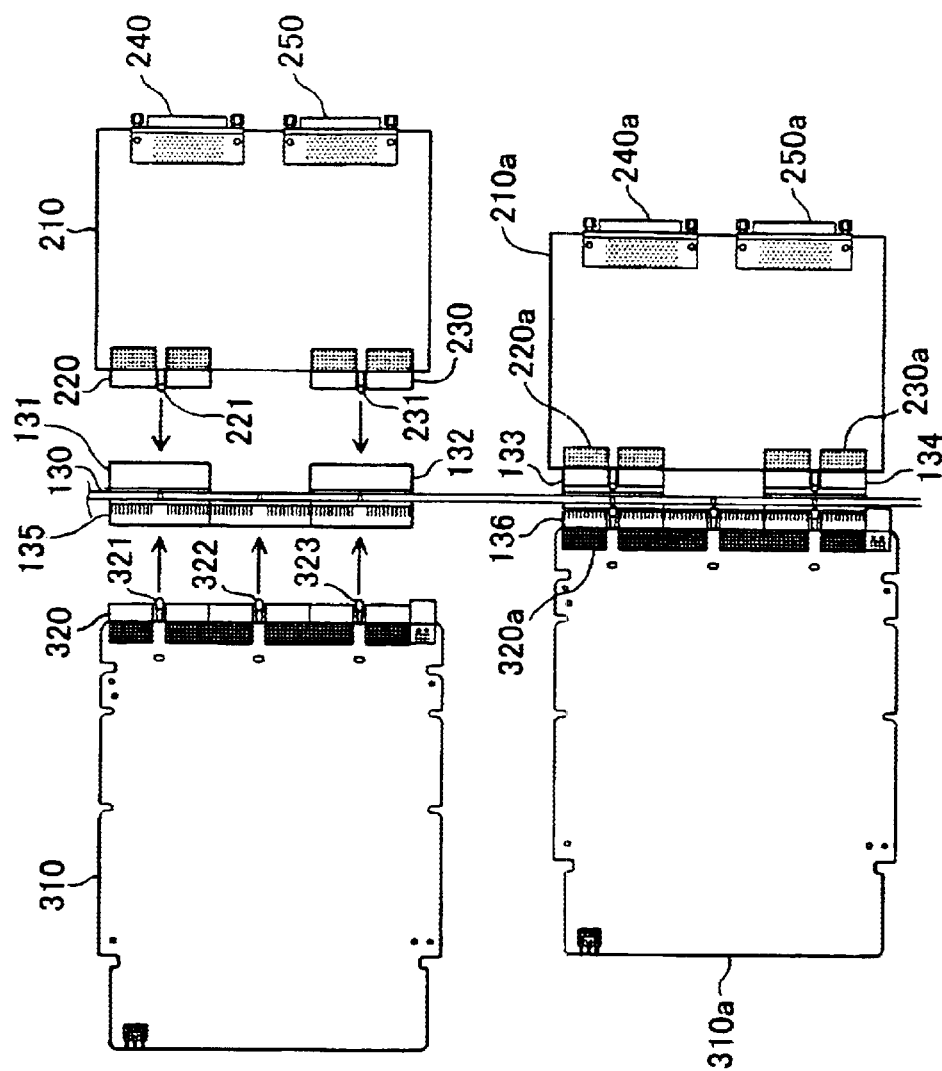
FIG. 5 is a view showing the correspondence of connected components between an electronic circuit board and a connector board.

FIG. 5 shows the correspondence of connected components between an electronic circuit board and a connector board. In the upper part of the figure, an electronic circuit board 310 and an connector board 210 which are ready to be plugged in are illustrated, while in the lower part of the figure, an electronic circuit board 310a and a connector board 210a which have already been plugged in are illustrated.

First, the construction of the electronic circuit board 310 and that of the connector board 210 before they are plugged in are described. The electronic circuit board 310 and the connector board 210 are plugged in at opposite locations on respective sides of the BWB 130. First seat connectors 135 are provided on the front surface of the BWB 130. On the rear surface of the BWB 130, there are provided separate second seat connectors 131, 132 at locations corresponding to respective ones of the first seat connectors 135. The first seat connectors 135 and the second seat connectors 131, 132 associated with each other use common contacts (pin members serving as connection terminals for connector connection). More specifically, the associated first seat connectors 135 have contacts thereof extending into the corresponding second seat connectors 131, 132, and functioning as contacts of the second seat connectors 131, 132, as well.

Male seat connectors 220, 230 are mounted, side by side, on one end of the connector board 210 in a manner corresponding to the respective second seat connectors 131, 132 on the BWB 130. External line connectors 240, 250 are mounted on an end of the connector board 210 opposite to the end on which the male seat connectors 220, 230 are mounted. The male seat connectors 220, 230 have connector guide keys 221, 231, respectively, arranged at the respective centers thereof. When the male seat connectors 220, 230 are connected to the respective second seat connectors 131, 132, the connector guide keys 221, 231 are brought into contact with the respective second seat connectors 131, 132, first and foremost, to guide the male seat connectors 220, 230 to the exact fronts of the respective second seat connectors 131, 132.

The electronic circuit board 310 has male seat connectors 320 mounted on one end thereof. The male connectors 320 have connector guide keys 321, 322, 323 arranged in respective central portions thereof. When the male seat connectors 320 are connected to the first seat connectors 135 on the BWB side, the connector guide keys 321, 322, 323 are brought into contact with the first seat connector 135, first and foremost, to guide the male connectors 320 to the exact front of the first seat connectors 135.

The electronic circuit board 310a and the connector board 210a, which have already been plugged in, are electrically connected to each other via the BWB 130. The connector board 210a is provided with male seat connectors 220a, 230a and external line connectors 240a, 250a. The male seat connectors 220a, 230a are connected to second seat connectors 133, 134 on the BWB 130, respectively. The electronic circuit board 310a is provided with male seat connectors 320a. The male seat connectors 320a are connected to first seat connectors 136 on the BWB 130.

In the present embodiment, as shown in FIG. 5, an electronic circuit board is in a one-to-one correspondence with a connector board, and the electronic circuit board and the connector board in the one-to-one correspondence are connected to each other via the BWB 130.

Figure 6:
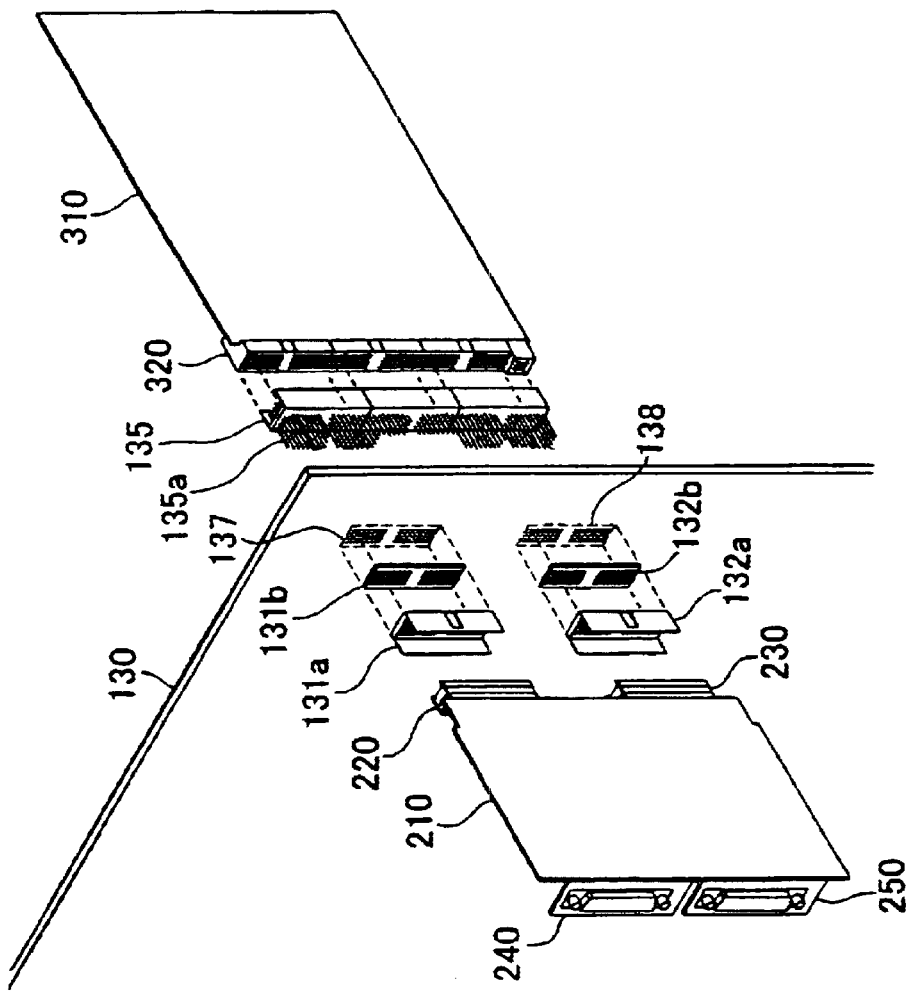
FIG. 6 is a perspective view showing the correspondence of connected components between the electronic circuit board and the connector board.

FIG. 6 shows the correspondence of connected components between an electronic circuit board and the corresponding connector board, in perspective. The first seat connectors 135 on the BWB 130 have a plurality of sets of contacts 135a fitted, side by side, therethrough for connection between the electronic circuit board 310 and the corresponding connector board 210. The BWB 130 is formed with two pairs of sets of through holes 137, 138 through each of which a corresponding one of the contacts 135a is inserted. At a location on the rear surface (which, in FIG. 6, is shown on this side) of the BWB 130 where the pair of sets of through holes 137 are open, there is fixedly mounted a shroud 131a via a spacer 131b, while at a location on the same where the other pair of sets of through hole 138 are open, there is fixedly mounted a shroud 132a via a spacer 132b. Each of the shrouds 131a, 132a and the spacers 131b, 132b is formed with two pairs of sets of holes through each of which a corresponding one of the contacts is inserted. The contacts 135a fitted through the first seat connector 135 are each inserted through the corresponding holes formed in the BWB 130, the corresponding shroud 131a or 132a, and the corresponding spacer 131b or 132b, to protrude from the rear surface of the BWB 130. Each pair of a spacer and a shroud forms a second seat connector.

The contacts 135a protruding from the shrouds 131a, 132a are fitted, respectively, in a plurality of holes formed in the male seat connectors 220, 230, whereby the male seat connectors 220, 230 are connected to the contacts 135a.

Figure 7A:
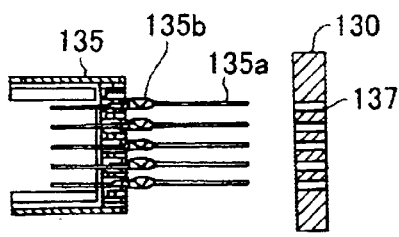
Figure 7B:
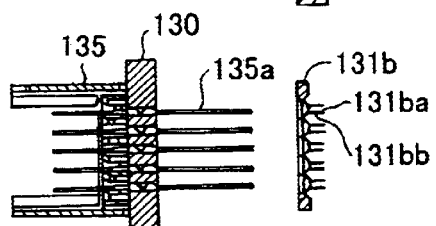
Figure 7C:
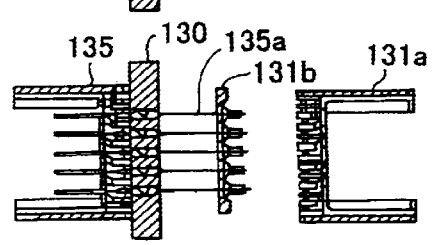
Figure 7D:
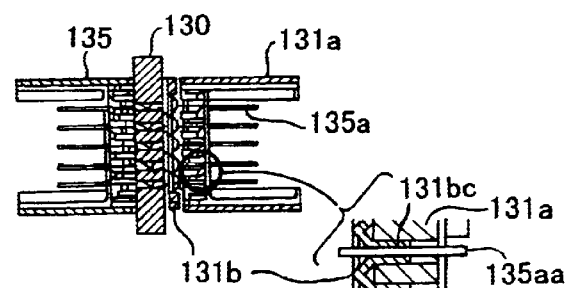
Figure 7E:
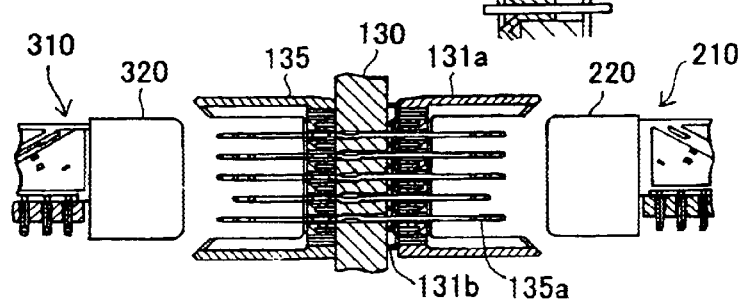

FIGS. 7(A) to 7(E) schematically show steps of assembling seat connectors to the BWB. FIG. 7(A) shows a step of assembling a first seat connector to the BWB. FIG. 7(B) shows a step of fitting a spacer to the resulting assembly, while FIG. 7(C) shows a step of mounting a shroud to thereby assemble the space and shroud (second seat connector) to the assembly of the first connector and the BWB. FIG. 7(D) shows a state of the seat connectors having been assembled to the BWB. Further, FIG. 7(E) is a view useful in explaining how an electronic circuit board and a connector board are plugged in.

As shown in FIG. 7(A), the contacts 135a fitted through the first seat connector 135 are inserted into the respective holes 137 from the front surface side of the BWB 130. The first seat connector 135 is a metallic connector and has press-fit portions 135b each formed at an intermediate portion of a contact 135a. The first seat connector 135 is firmly secured to the BWB 130 by the press-fit portions 135b. Further, the contacts 135a of the first seat connector 135 are adjusted in length such that they protrude from the rear surface of the BWB 130 by an appropriate length in a state press-fitted into the BWB 130.

Then, as shown in FIG. 7(B), the portions of the contacts 135a protruding from the rear surface of the BWB 130 are fitted through the respective holes 131ba formed through the spacer 131b. The holes 131ba of the spacer 131b each extend through a projection 131bb of the spacer 131b. Further, as shown in FIG. 7(C), the shroud 131a is fitted from the rear surface of the BWB 130.

In the assembly of the seat connectors 130, 135 and the BWB 130, the contacts 135aa protrude within the shroud 131a as shown in FIG. 7(D). In this state, the spacer 131b is pressed against the BWB 130, and the projections 131bc of the spacer 131b through which the respective holes of the spacer 131b extend are press-fitted into respective holes formed in the shroud 131a. This causes the contacts 135aa to be clamped by the respective projections 131bc, and the shroud 131a to be fixedly mounted.

As shown in FIG. 7(E), the male seat connector 320 of the electronic circuit board 310 is fitted in the first seat connector 135, while the male seat connector 220 of the connector board 210 is fitted in the second seat connector formed by the shroud 131a and the spacer 131b.

It should be noted that the contacts 135a projecting from the rear surface of the BWB 130 can be adjusted in length of projection by changing the thickness of the spacer according to the thickness of the BWB 130.

The second seat connector in a one-to-one correspondence with the first seat connector is formed by the steps described above. An electronic circuit board 310 in an electronic circuit unit is plugged in from the front side of the BWB 130, and a connector board 210 in a connector unit is plugged in from the rear side of the BWB 130, whereby the boards 310 and 210 are electrically connected to each other via the contacts. In other words, main signal wiring between the electronic circuit unit and the connector unit does not require the use of printed wiring patterns on the BWB 130.

Next, description will be made of an example of the construction of a connector unit, configured for the EMC protection.

First, an example of a first order-group interface connector unit is described in detail with reference to FIGS. 8 and 9.

Figure 8:
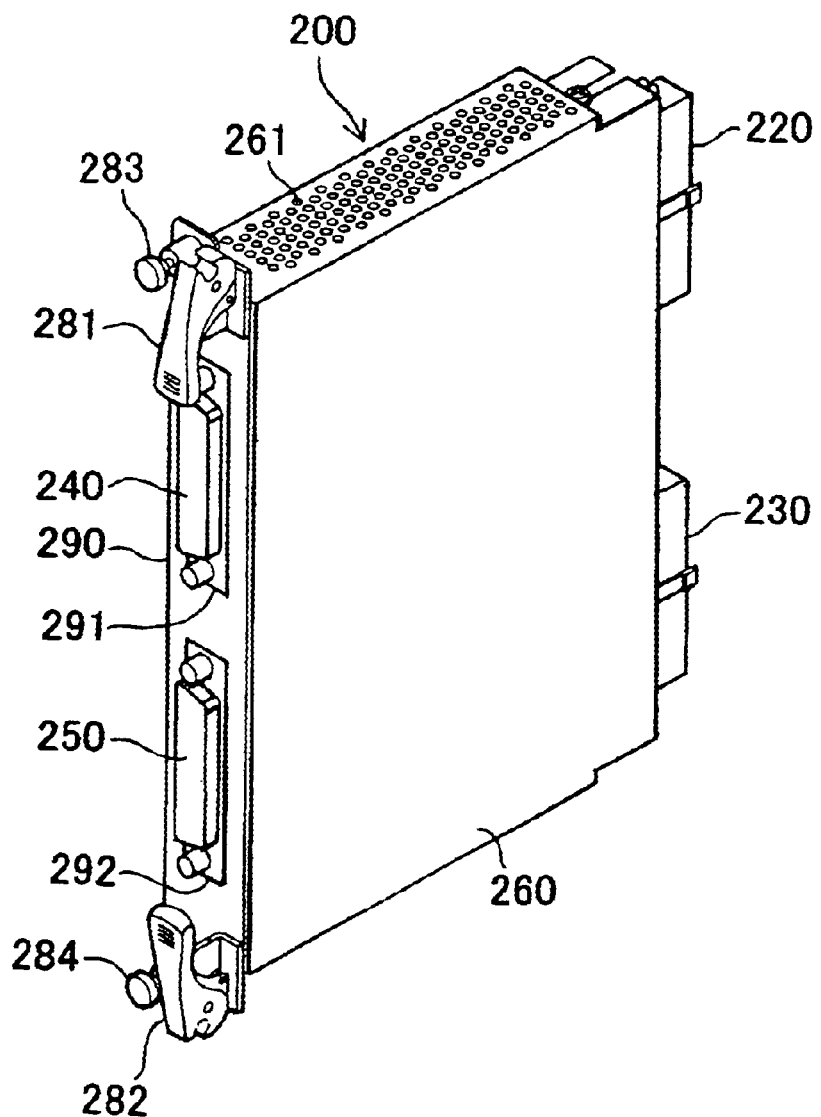
FIG. 8 is a perspective view of a first order-group interface connector unit.

FIG. 8 is a perspective view of the first order-group interface connector unit. The figure shows a connector unit 200 corresponding to an electronic circuit unit as a first order-group interface. The connector unit 200 has a connector board enclosed in a metal shield case 260. The shield case 260 has an upper wall formed with a plurality of ventilating holes 261. On the front of the shield case 260, there is mounted a front panel 290 formed with slots 291, 292 for use in connection between the connector board and external line connectors. The external line connectors 240, 250 are fitted through the slots 291, 292, respectively. Further, insertion levers 281, 282 are attached to upper and lower ends of the front panel 290, respectively. A lock screw 283 is provided beside the insertion lever 281, while a lock screw 284 is provided beside the insertion lever 282.

Figure 9:
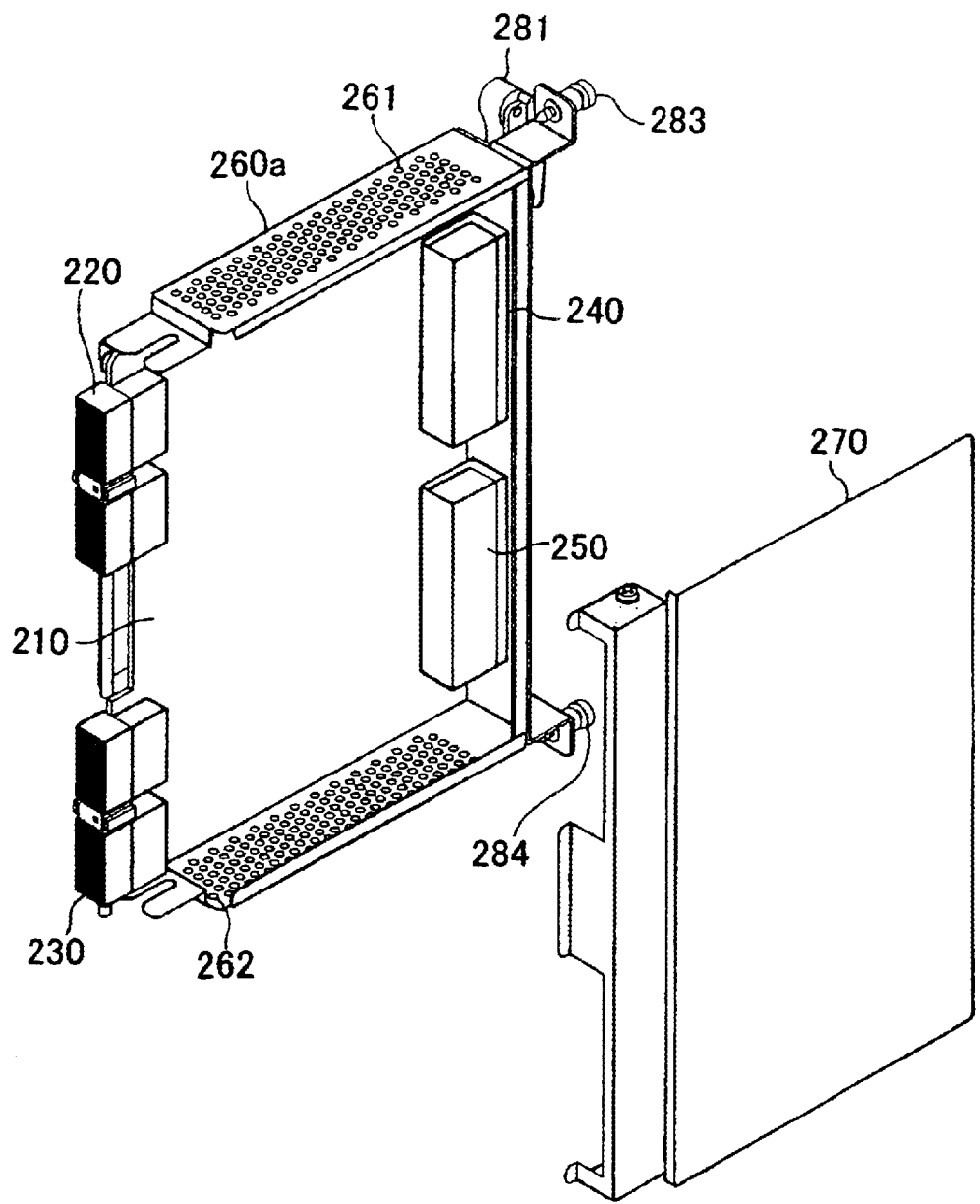
FIG. 9 is an exploded perspective view of the first order-group interface connector unit.

FIG. 9 is an exploded perspective view of the first order-group interface connector unit. The figure shows the FIG. 8 connector unit in an exploded state, as viewed from a side opposite to the side from which the connector unit is viewed in FIG. 8. As shown in the figure, the shield case of the connector unit 200 is comprised of a shield case body 260a formed with an opening, and a lid mechanism portion 270 removably mounted in a position for closing the opening of the shield case body 260a.

The shield case body 260a houses a connector board 210. Male seat connectors 220, 230 and external line connectors 240, 250 are connected to the connector board 210. The male seat connectors 220, 230 are arranged at the BWB-side insertion end of the connector board 210, while the external line connectors 240, 250 are arranged at an end of the connector board 210 opposite to the BWB-side insertion end of the same. The upper wall of the shield case body 260a is formed with the plurality of ventilating holes 261 mentioned above with reference to FIG. 8. Further, the shield case body 260a has a lower wall thereof also formed with a plurality of ventilating holes 262. The ventilating holes are each formed to have a limited size and arranged such that leakage of electromagnetic radiation can be limited. The ventilating holes each function as an inlet port for introducing air into the shield case and an outlet port allowing air to flow out from the shield case.

Next, an example of the construction of a third-to-fourth order-group interface connector unit will be described with reference to FIGS. 10 and 11.

Figure 10:
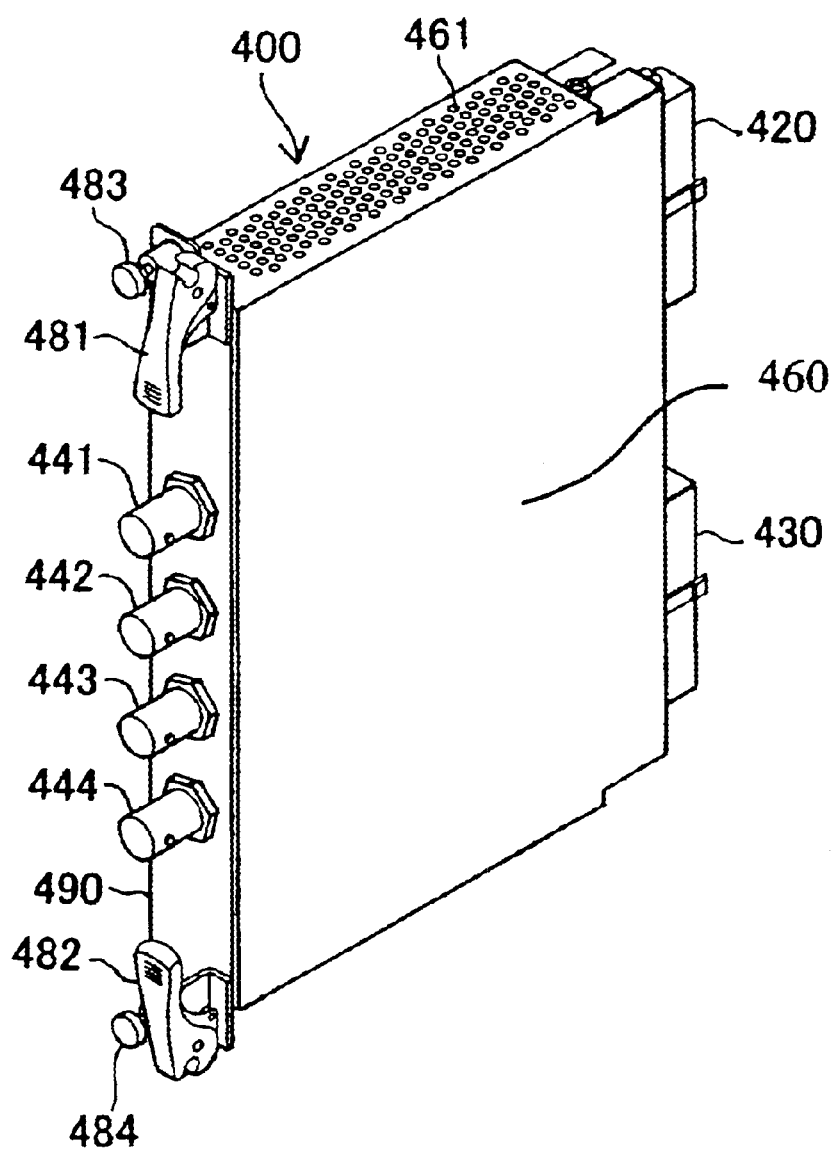
FIG. 10 is a perspective view of a third-to-fourth order-group interface connector unit.

FIG. 10 is a perspective view of the third-to-fourth order-group interface connector unit. The figure shows the connector unit 400 corresponding to an electronic circuit unit as a third-to-fourth order-group interface. The connector unit 400 has a shield case 460 housing a connector board. The shield case 460 has an upper wall thereof formed with a plurality of ventilating holes 461. On the front of the shield case 460, there is mounted a front panel 490 having external line connectors 441 to 444 mounted thereto. Further, insertion levers 481, 482 are attached to upper and lower ends of the front panel 490, respectively. A lock screw 483 is provided beside the insertion lever 481, while a lock screw 484 is provided beside the insertion lever 482.

Figure 11:
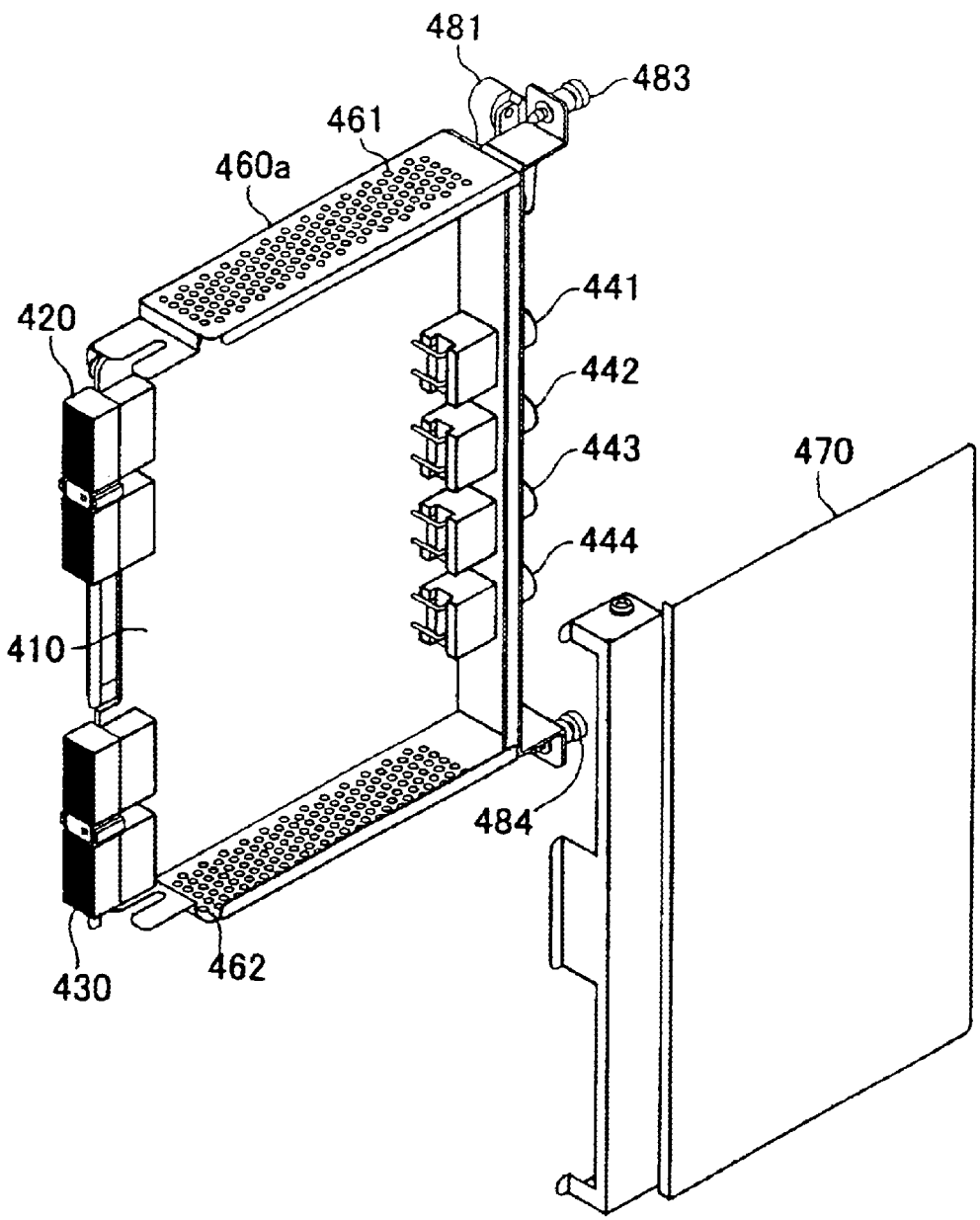
FIG. 11 is an exploded perspective view of the third-to-fourth order-group interface connector unit.

FIG. 11 is an exploded perspective view of the third-to-fourth order-group interface connector unit. The figure shows the FIG. 10 connector unit in an exploded state, as viewed from a side opposite to the side from which the connector unit is viewed in FIG. 10. As shown in FIG. 11, the shield case of the connector unit 400 is comprised of a shield case body 460a, and a lid mechanism portion 470. The lid mechanism portion 470 is removably attached to the shield case body 460a.

The shield case body 460a houses the connector board 410. Male seat connectors 420, 430 and external line connectors 441 to 444 are connected to the connector board 410. The upper wall of the shield case body 460a is formed with the plurality of ventilating holes 461 mentioned above with reference to FIG. 10. Further, the shield case body 460a has a lower wall thereof also formed with a plurality of ventilating holes 462.

As shown in FIGS. 8 to 11, in each of the connector units, the connector board is housed in the shield case. The connector unit is provided with the insertion levers, so that it can be inserted by utilizing the principle of the leverage. Further, by tightening the lock screws, it is possible to ensure electrical conductivity between the shield case and the connector unit-receiving block, thereby enhancing ESD (Electrostatic Discharge) protection, as well as to secure the shield case and the connector unit-receiving block to each other firmly. Moreover, since each connector unit is formed with the upper and lower ventilating holes, heat generated from the connector board can be dissipated to the outside from the connector unit.

In the following, steps of housing a connector unit will be described.

First, a worker starts inserting the connector unit into a predetermined slot in the connector unit-receiving block. This causes the top and bottom of the rear end of the connector unit to be fitted in the respective guide rails, and the connector unit to be guided to a predetermined position along the guide rails. Then, when the worker presses the connector unit deeper into the slot, the connector guide keys come into contact with seat connectors on the BWB, whereby the male seat connectors on the connector board are guided to proper positions. When the connector unit is inserted further deeper, the shield case of the connector unit presses the springs within the shield box, and the springs hold the shield case. When the connector unit is inserted still deeper, the insertion levers are brought into engagement with the slits of the connector unit-receiving block.

Then, when the operator pivotally moves each of the insertion levers to its horizontal position, the connector unit is inserted even deeper, and the front panel of the connector unit is brought into abutment with the connector unit-receiving block, whereby the male seat connectors on the connector board are fitted in the respective seat connectors on the BWB. Then, when the operator tightens the lock screws, the connector unit is firmly secured to the connector unit-receiving block. Since the connector unit is thus secured to the connector unit-receiving block by tightening the lock screws, it is possible to prevent degradation of the fitted state of the connector unit due to the weight of external cables (e.g. withdrawal of the connector unit caused by the weight of external cables). Moreover, since the front panel is held in contact with the connector unit-receiving block, the EMC performance is enhanced, and ESD protection is achieved.

Figure 12:
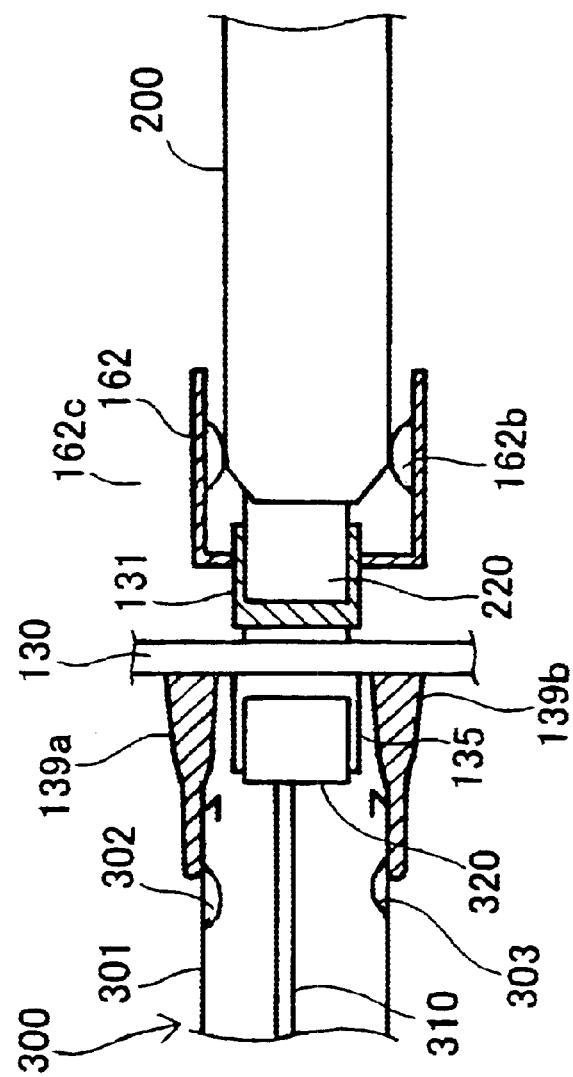
FIG. 12 shows a connector unit fitted in the subrack.

FIG. 12 shows the connector unit fitted in the subrack. As shown in the figure, the connector unit 200 is fitted in the shield box 162. The connector unit 200 is held by the lateral-side springs 162b, 162c within the shield box 162. The male seat connector 220 on the connector unit 200 is fitted in the second seat connector 131 on the BWB 130.

The male seat connector 320 mounted on the electronic circuit board 310 within the electronic circuit unit 300 is fitted in the first seat connector 135 on the BWB. Ribs 139a, 139b of the shield box extend at respective locations upward and downward of the first seat connector 135, as viewed in the figure. A shield case 301 enclosing the electronic circuit board of the electronic circuit unit 300 is fitted in the shield box having the ribs 139a, 139b. The shield case 301 of the electronic circuit unit 300 has springs 302, 303 provided on the inner surfaces thereof. The springs 302, 303 each have a resilient force acting in a direction of urging the shield case 301 outward.

The connector unit 200 is pressed from both sides by the lateral-side springs 162b, 162c, whereby electrical contact between the shield box 162 and the connector unit 200 is maintained. On the other hand, the electronic circuit unit 300 has its shield case 301 pressed outward by the springs 302, 303 whereby the shield case 301 is held in intimate contact with the ribs 139a, 139b, thereby ensuring electrical contact between the shield box and the electronic circuit unit 300. The shield case of the connector unit 200 and that of the electronic circuit unit 300 are each held in electrical contact with the BWB 130, whereby an entire conduction path for a electric signal between the electronic circuit unit 300 and the connector unit 200 is shielded against electromagnetic interference.

By the way, assemblage of a subrack and a connector unit can cause assembly errors. If an assembly error is so large as to adversely affect the fitted position of the connector board, the shielding effect can be spoiled. To avoid this problem, in the connector unit 200 of the present embodiment, the end of the connector board 210 on which the male seat connectors 220, 230 are mounted is held off the shield case 260, in a floating state. In the following, the floating mechanism of the floating board 210 will be described.

Figure 13:
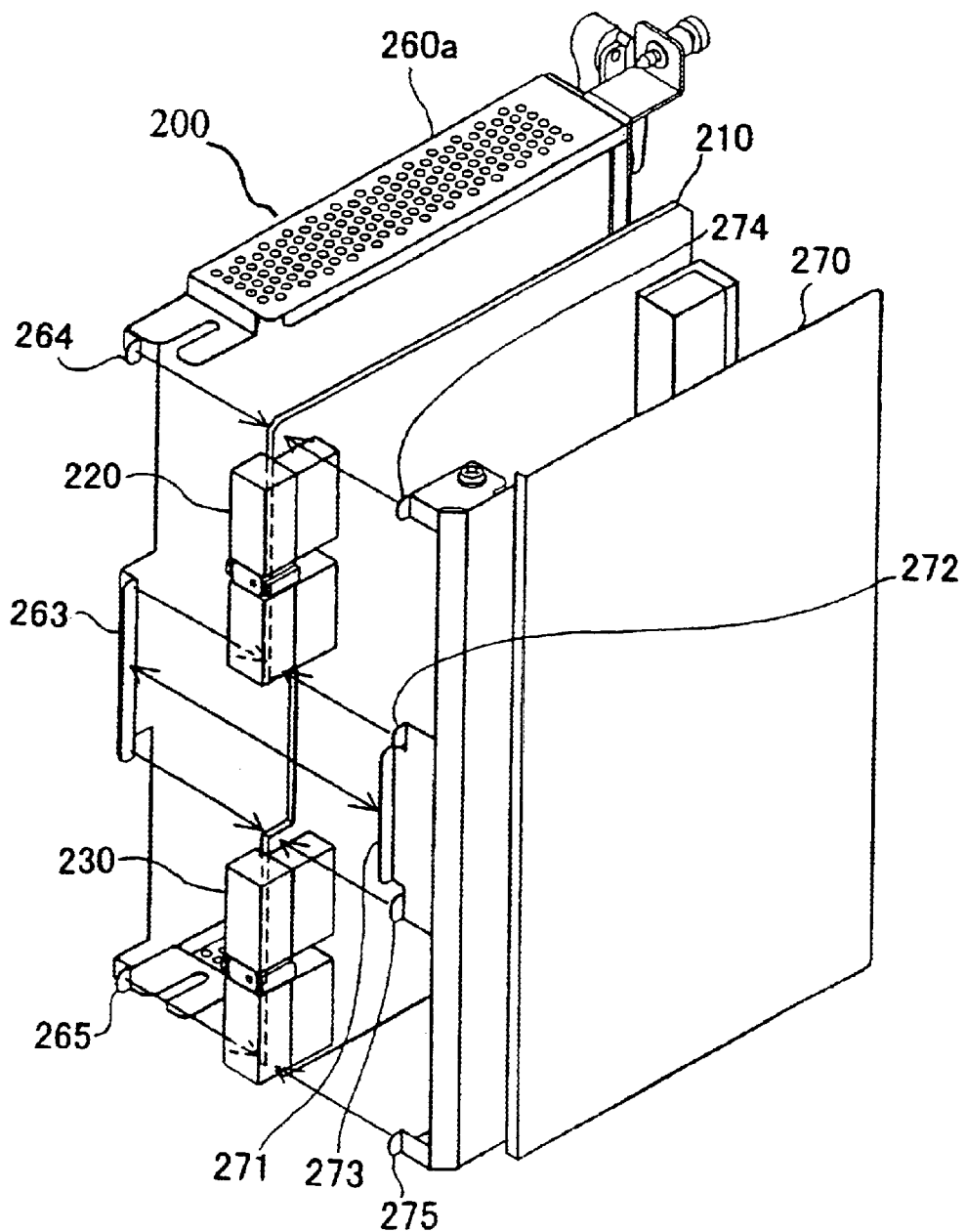
FIG. 13 is a view useful in explaining a floating mechanism in the connector unit.

FIG. 13 is a view useful in explaining the floating mechanism in the connector unit. The shield case body 260a of the connector unit 200 is provided with side plates 263 to 265. The lid mechanism portion 270 has a side plate 271 formed at a location corresponding to that of the side plate 263 of the shield case body 260a. On opposite sides of the side plate 271, there are formed side plates 272, 273 at respective locations such that they laterally inwardly protrude by a smaller amount than the side plate 271. Further, the lid mechanism portion 270 has side plates 274, 275 formed at respective locations corresponding to those of the side plates 264, 265 of the shield case body 260a such that they are laterally inwardly protruded. The amount of inward protrusion of each of the side plates 274, 275 is smaller than the side plate 271.

When the lid mechanism portion 270 is attached to the shield case body 260a, the side plate 263 of the shield case body 260a and the side plate 271 of the lid mechanism portion 270 are brought into contact with each other. Between the side plate 263 of the shield case body 260a and the side plate 272 or 273 of the lid mechanism portion 270, an end of the connector board 210 is held in a floating state. Also between the side plates 264, 265 of the shield case body 260a and the side plates 274, 275 of the lid mechanism portion 270, the end of the connector board 210 is held in a floating state.

Figures 14B, 14C:
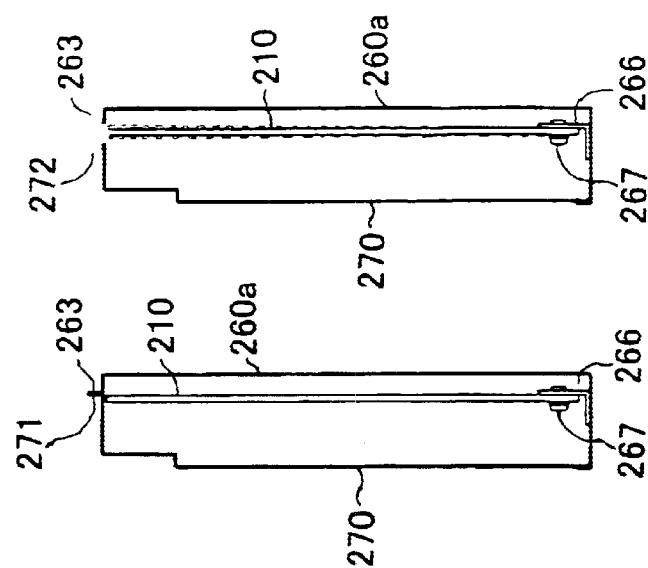
Figure 14A:
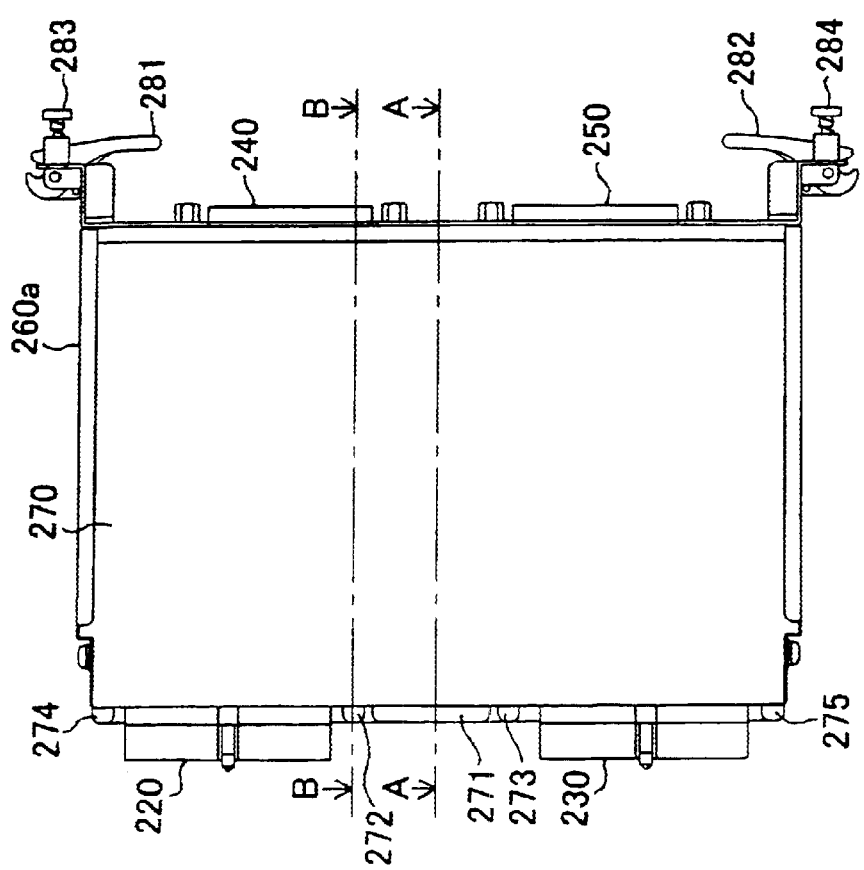

FIGS. 14(A) to 14(C) show the relationship between the shield case and the connector board connected to each other. FIG. 14(A) shows the connector board in side view. FIG. 14(B) is a sectional view taken on line A—A of FIG. 14(A), while FIG. 14(C) is a sectional view taken on line B—B of FIG. 14(A).

As shown in FIG. 14(A), the side plate 271 is located at an approximately vertically central portion of the connector unit 200. As shown in FIG. 14(B), the side plate 271 of the lid mechanism portion 270 and the side plate 263 of the shield case body 260a are held in immediate contact with each other. The side plate 271 and the side plate 263 have respective end portions thereof bent outward in parallel with other, and the bent planar end portions of the two side plates 271, 263 are held in contact with each other.

On the other hand, as shown in FIG. 14(C), the side plate 272 of the lid mechanism portion 270 and the side plate 263 of the shield case body 260a are opposed to each other in a manner spaced from each other. The connector board 210 is placed in the floating state between the side plate 272 and the side plate 263. The side plate 272 and the side plate 263 have respective end portions thereof bent outward in parallel with each other. The space formed between the side plate 272 and the side plate 263 is a floatable range of the connector board 210. In the figure, the floatable range of the connector board 210 is designated by dotted lines. It should be noted that the external line connector-side end of the connector board 210 is attached by a screw 267 to an L-shaped plate secured to the shield case body 260a.

Figure 15:
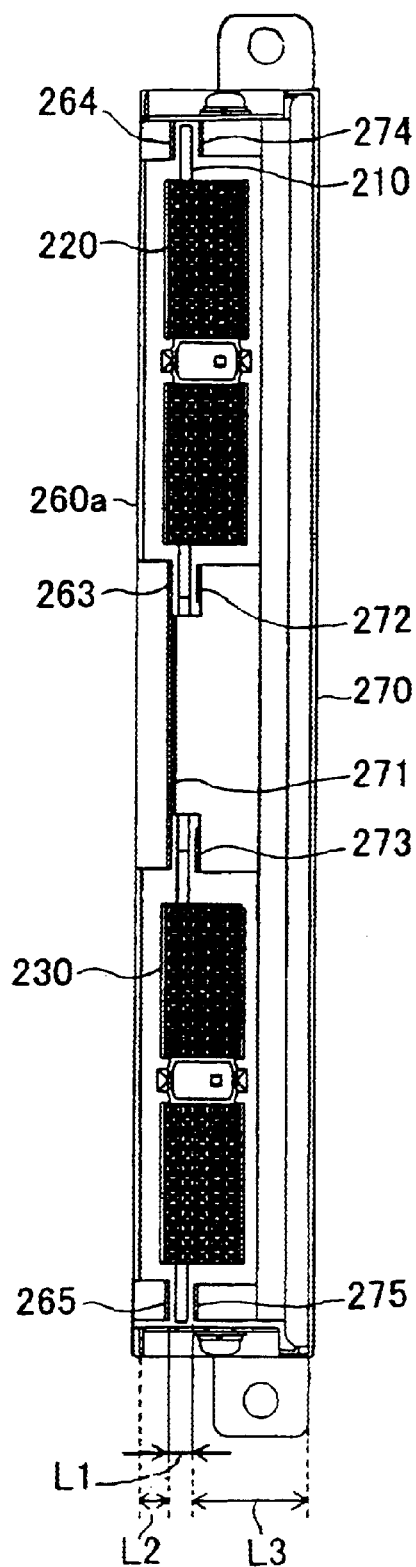
FIG. 15 is a rear view of the connector unit.

FIG. 15 is a rear view of the connector unit. As shown in the figure, spaces formed between the side plates 263, 264, 265 of the shield case body 260a and the side plates 272 to 275 of the lid mechanism portion 270, respectively, determine a floatable range L1 of the connector board 210. Between the front surface of the connector board 210 and an inner side surface (left-side inner side surface as viewed in the figure) of the shield case, there is formed a space L2 as a component mounting space. Similarly, between the rear surface of the connector board 210 and an opposite inner side surface (right-side inner side surface as viewed in the figure) of the shield case, there is formed a space L3 as a component mounting space.

According to this structure, the male seat connector-side end of the connector board 210 can move freely within the floatable range L1. As a result, the male seat connectors 220, 230 can be fitted in the second seat connectors on the BWB without difficulty. In other words, the connector board 210 can be fitted in the second seat connectors without receiving any strain at any portion thereof.

Further, the float range of the connector board 210 is limited to the floatable range L1, so that the component mounting spaces L2, L3 can be positively provided on the respective front and rear sides of the connector board 210. As a result, the connector board 210 is prevented from moving too close to the front-side or rear-side inner surface of the shield case and bringing components and leads thereon into contact with the shield case.

Further, since the side plate 263 of the shield case body 260a and the side plate 271 of the lid mechanism portion 270 are held in abutment with each other, even when pressed by the springs of the shield box, the shield case is not deformed.

It should be noted that the shield case of the connector unit of the embodiment can be easily opened and closed by the lid mechanism portion 270. In the following, the shield structure of the lid mechanism portion 270 will be described.

Figure 16:
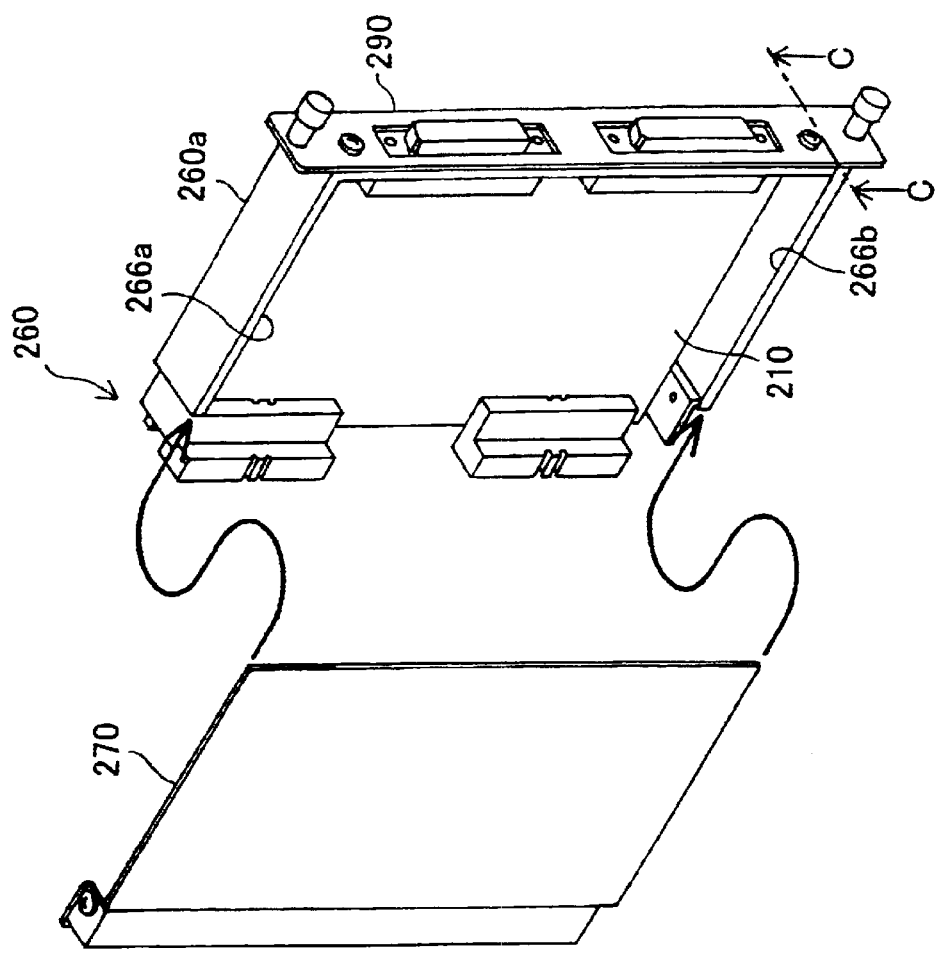
FIG. 16 shows a method of mounting a lid mechanism portion.

FIG. 16 illustrates a method of mounting the lid mechanism portion to the shield case body. The shield case body 260a has grooves 266a, 266b formed at the respective upper and lower ends defining the opening. When the lid mechanism portion 270 is mounted, an end of the lid mechanism portion 270 is fitted in the grooves 266a, 266b of the shield case body 260a from the rear side (left side as viewed in FIG. 16) of the shield case body 260a. Then, the lid mechanism portion 270 is slid until the end thereof is brought into contact with the front panel 290, whereby the opening of the shield case body 260a is closed by the lid mechanism portion 270.

FIGS. 17(A) and 17(B) show the shield structure of one of the grooves of the shield case body. FIG. 17(A) shows a spring structure provided in the groove of the shield case body, while FIG. 17(B) shows the shape of a spring arranged in the groove. As shown in FIG. 17(A), the groove 266a has a plurality of springs 267, 267a, 267b, 267c arranged therein such that they form wavy shapes in a direction of sliding of the lid mechanism portion 270. As shown in FIG. 17(B), the spring 267 is in the form of a rectangular plate having one end portion thereof bent into a form of a mountain. When a force is applied to the spring 267 in a direction of depressing the mountain, the spring 267 generates a resilient force against the pressing force. Each of the springs is disposed in the groove 266a such that a plane portion (i.e. portion other than the slopes of the mountain) of the spring is positioned on a rear side with respect to the direction of insertion of the lid mechanism portion 270.

When the lid mechanisms portion 270 is inserted along the groove 266a within which the plurality of springs are arranged as described above, the lid mechanism portion 270 depresses the mountain of each of the springs. As a result, each spring generates the resilient force acting in the direction of pressing the lid mechanism portion 270. The groove 266b is identical in structure to the groove 266a, and hence when the lid mechanism portion 270 is fitted in the two grooves 266a, 266b, the upper and lower ends of the lid mechanism portion 270 are held in firm and intimate contact with the shield case body 260a. Thus, electrical conductivity between the lid mechanism portion 270 and the shield case body 260a is ensured, and the inside of the shield case is shielded from electromagnetic interference.

Figure 18:
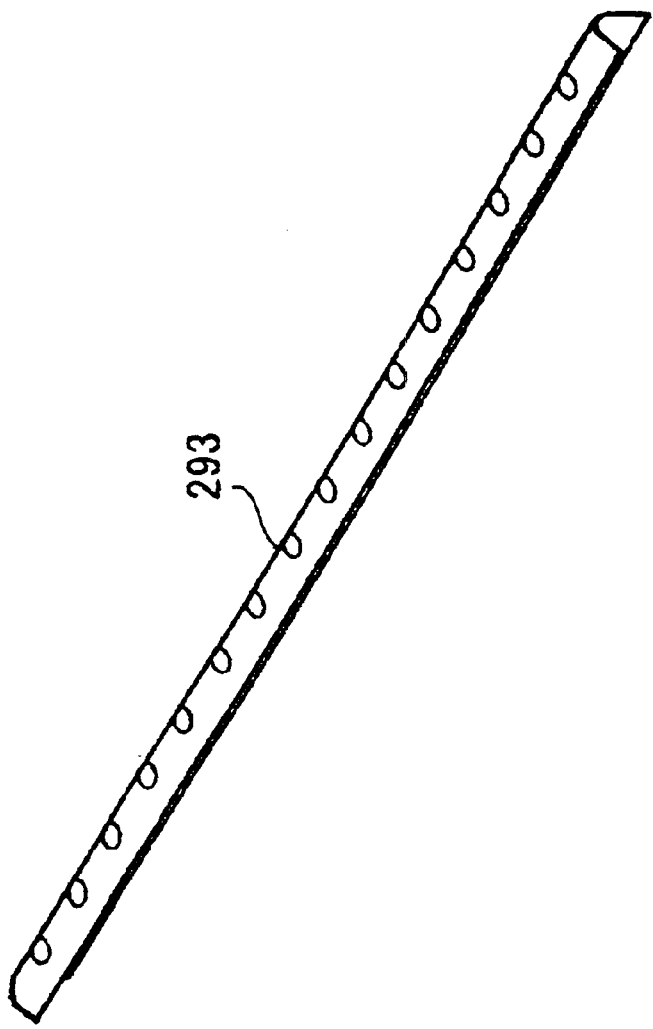
Figure 18:
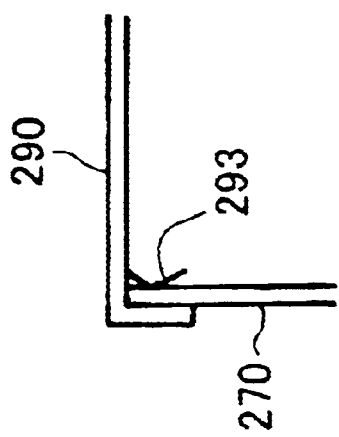

FIGS. 18(A) and 18(B) show the shield structure of the front panel of the shield case body. FIG. 18(A) is a sectional view taken on line C—C of FIG. 16. FIG. 18(B) shows the shape of a spring attached to the front panel. As shown in FIG. 18(A), the spring 293 is attached to the inner surface of the front panel 290. The lid mechanism portion 270 is inserted between the front panel 290 and the spring 293. As shown in FIG. 18(B), the spring 293 is formed of a metal strip having an end along a longitudinal side thereof bent to form a shape rounded in cross-section. When the rounded-shape portion is pressed, the spring 293 generates a resilient force against the pressing force.

According to this structure, when the lid mechanism portion 270 is inserted between the front panel 290 and the spring 293, the rounded-shape portion of the spring 293 is pressed by the lid mechanism portion 270. As a result, the spring 293 generates the resilient force acting in a direction of pressing the lid mechanism portion 270, whereby the front end of the lid mechanism portion 270 is pressed against the shield case body 260a. Thus, the electrical conductivity between the lid mechanism portion 270 and the shield case body 260a is ensured, and the inside of the shield case is shielded from electromagnetic interference.

The upper and lower as well as front ends of the lid mechanism portion 270 are thus held in intimate contact with the shield case body 260a. On the other hand, the rear end of the lid mechanism portion 270 is received within the shield box when the lid mechanism portion 270 is inserted into the subrack. Further, a sufficient shield structure is provided between the shield box and the shield case. Therefore, it is not required to provide a shield structure between the rear end of the lid mechanism portion 270 and the shield case body 260a.

As described above, even when the connector unit is configured such that it can be opened and closed by the lid mechanism portion 270, once the lid mechanism portion 270 is closed, excellent EMC performance can be achieved. Further, since the lid mechanism portion 270 can be easily opened and closed, it is possible to operate a switch or the like arranged on the connector board 210, without any difficulty. For instance, the connector board 210 is provided with a switch for changing circuit characteristics according to an environment in which the transmission apparatus is installed. The switch of this kind is required to be operated at a site where the transmission apparatus is installed. Therefore, the construction of the connector unit of the present embodiment which enables the operator to easily open and close the lid mechanism portion 270 can enhance the efficiency of operations for installing the transmission apparatus.

Each connector board incorporates an EMI circuit. The EMI circuit prevents electromagnetic interference (EMI) with signal lines. It should be noted that on the connector board, there are provided a circuit for a signal to be transmitted to the outside from each electronic circuit unit, and a circuit for a signal to be received from the outside by the same, separately from each other.

In the following, an example of an impedance converter of an unbalanced type will be described with reference to FIGS. 19 and 20.

Figure 19:
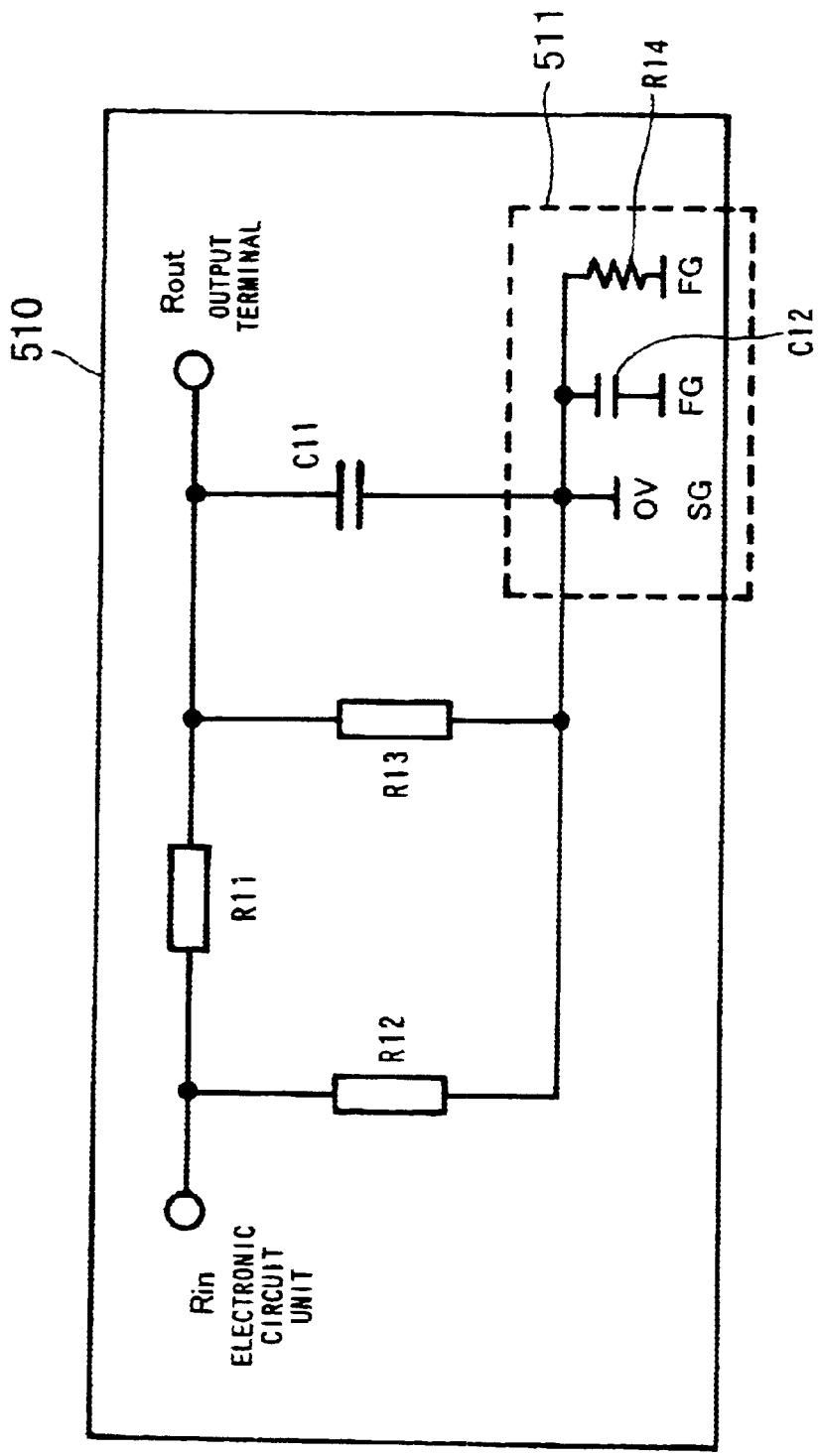
FIG. 19 is a circuit diagram of an output side of the connector board.

FIG. 19 shows an output circuit of the connector board 510. An input terminal Rin and an output terminal Rout are connected to each other via a resistor R11. Further, the input terminal Rin is connected to an EMI circuit 511 via a resistor R12. The output terminal Rout is connected to the EMI circuit 511 via a resistor R13 and a capacitor C11 which are connected in parallel with each other.

In the EMI circuit 511, respective terminals of the resistors R12, R13 and the capacitor C11 are connected to a signal ground (0V) SG. Further, the respective terminals of the resistors R12, R13 and the capacitor C11 are connected to a frame ground (FG) via a capacitor C12 as well as via a resistor R14.

Figure 20:
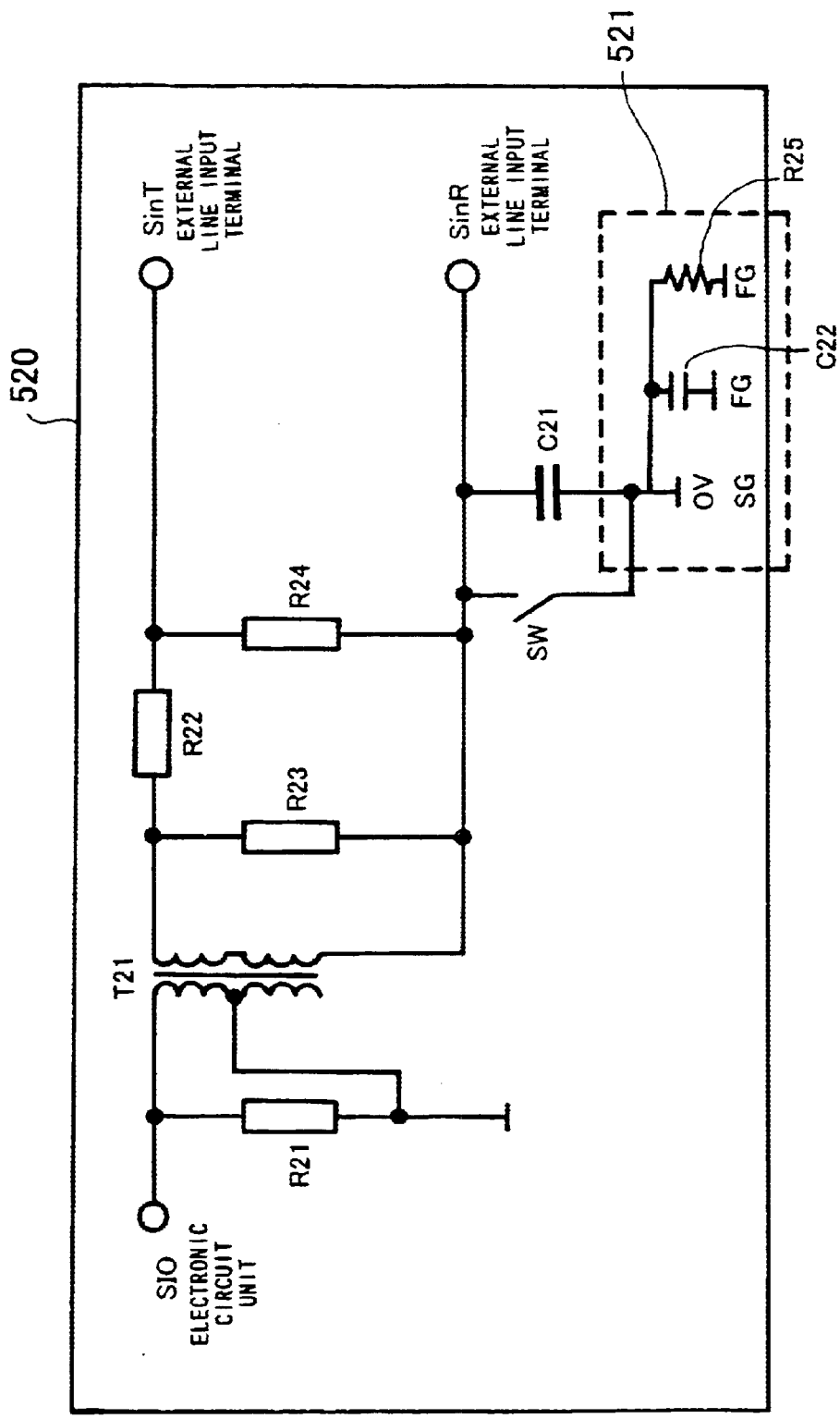
FIG. 20 is a circuit diagram of an input side of the connector board.

FIG. 20 shows an input circuit of the connector board 520. An external line input terminal SinT is connected to one end of one coil (primary coil) of a transformer T21 via a resistor R22. On the other hand, an external input terminal SinR is connected to the other end of the primary coil of the transformer T21. The external line input terminal SinT and the external input terminal SinR are connected to each other via a resistor R24. Further, a resistor R23 is connected in parallel with the primary coil of the transformer T21. The other coil (secondary coil) of the transformer T21 has one end thereof connected to an output terminal SIO to the electronic circuit unit. The output terminal SIO is connected to a signal ground (0V) SG via a resistor R21. Further, the secondary coil has the other end (drawn out from an intermediate portion of the coil) thereof also connected to the signal ground (0V) SG.

The external input terminal SinR is connected to an EMI circuit 521 via a capacitor C21. In the EMI circuit 521, the terminal of the capacitor C21 is connected to the signal ground (0V) SG. Further, the terminal of the capacitor C21 is grounded to a frame ground (FG) via a capacitor C22 as well as via a resistor R25. A switch SW is arranged in parallel with the capacitor C21.

The EMI circuits incorporated in the respective output and input circuits as described above make it possible to eliminate electromagnetic interference with a signal inputted to the electronic circuit unit. Further, the switch SW can be turned on or off depending on an environment in which the transmission apparatus is installed, so that it is possible to obtain a circuit characteristic dependent on the environment. Moreover, since the output and input circuits are connected to the frame ground FG in the respective EMI circuits via the resistors R14, R25, respectively, electric charges stored in the circuits due to generation of static electricity are discharged. The resistors R14, R25 are connected to the frame ground FG at the front panel or in the vicinity of the same.

It should be noted that in the first order-group interface, an external line connector is adaptable to both circuits of a balanced type and an unbalanced type. In the first order-group interface, a multi-pin connector can be employed in an external line connector so as to receive lots of lines within the connector. In the third-to-fourth order-group interface, a coaxial connector, for instance, is used as an external line connector.

In the following, description will be made of a shield structure of an external line connector.

Ideal electromagnetic shielding between the subrack and an external cable is achieved by holding a shielding material of the external cable in contact with a casing of the frame ground FG having a chassis structure, over the whole circumference of a conductor of the external cable. However, in the case of a multi-pin connector having lots of cables received therein, as for use with the first order-group interface, or a coaxial connector for use with the third-to-fourth order-group interface, even if a connector for external cables is mounted in intimate contact with the front panel, it is impossible to obtain the ideal shield structure. To overcome this problem, in the present embodiment, the signal ground wire SG for a main signal and the frame ground FG are capacitively coupled with each other by a coupling capacitor, to thereby cut off noise components.

Figure 21:
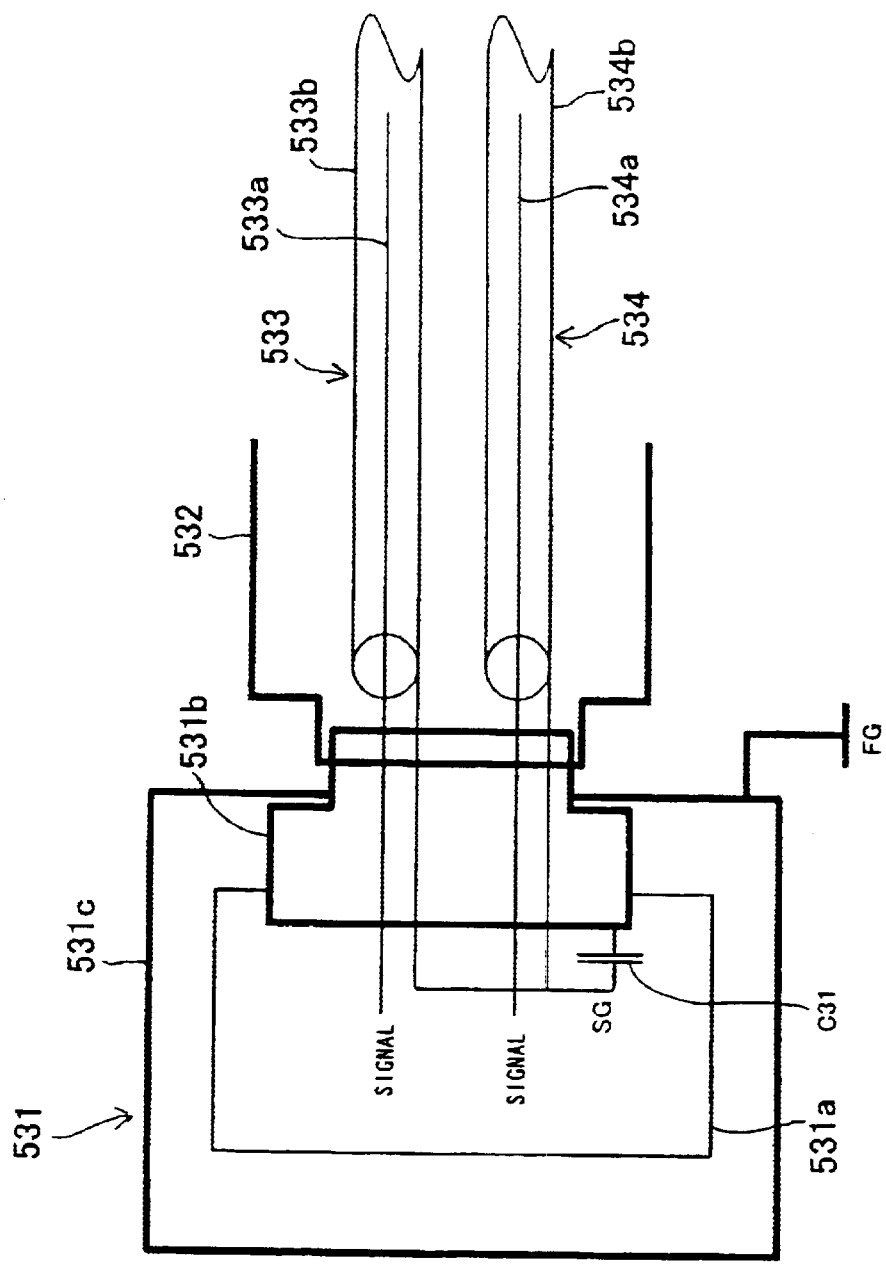
FIG. 21 is a conceptual representation of a first order-group interface unbalanced shield structure.

FIG. 21 is a conceptual representation of a shield structure for an unbalanced-type connector for the first order-group interface. In the FIG. 21 example, an external cable is connected to a connector unit 531 of an unbalanced type for the first order-group interface by a half pitch D-sub (D-subminiature: a standard for a connector widely used for connection for computers and electronic equipment) connector 532. The external cable includes a plurality of coaxial cables 533, 534. Conductors 533a, 534a arranged in the respective centers of the coaxial cables 533, 534 are signal lines connected to a circuit of a connector board 531a. Sheaths 533b, 534b of the respective coaxial cables 533, 534 are connected to an external line connector 531b via a coupling capacitor C31 of the connector board 531a. The coupling capacitor C31 corresponds to the capacitor C12 in FIG. 19 and the capacitor C22 in FIG. 20. The external line connector 531b is connected to a shield case 531c. Further, the shield case 531c is connected to the frame ground (FG).

Figure 22:
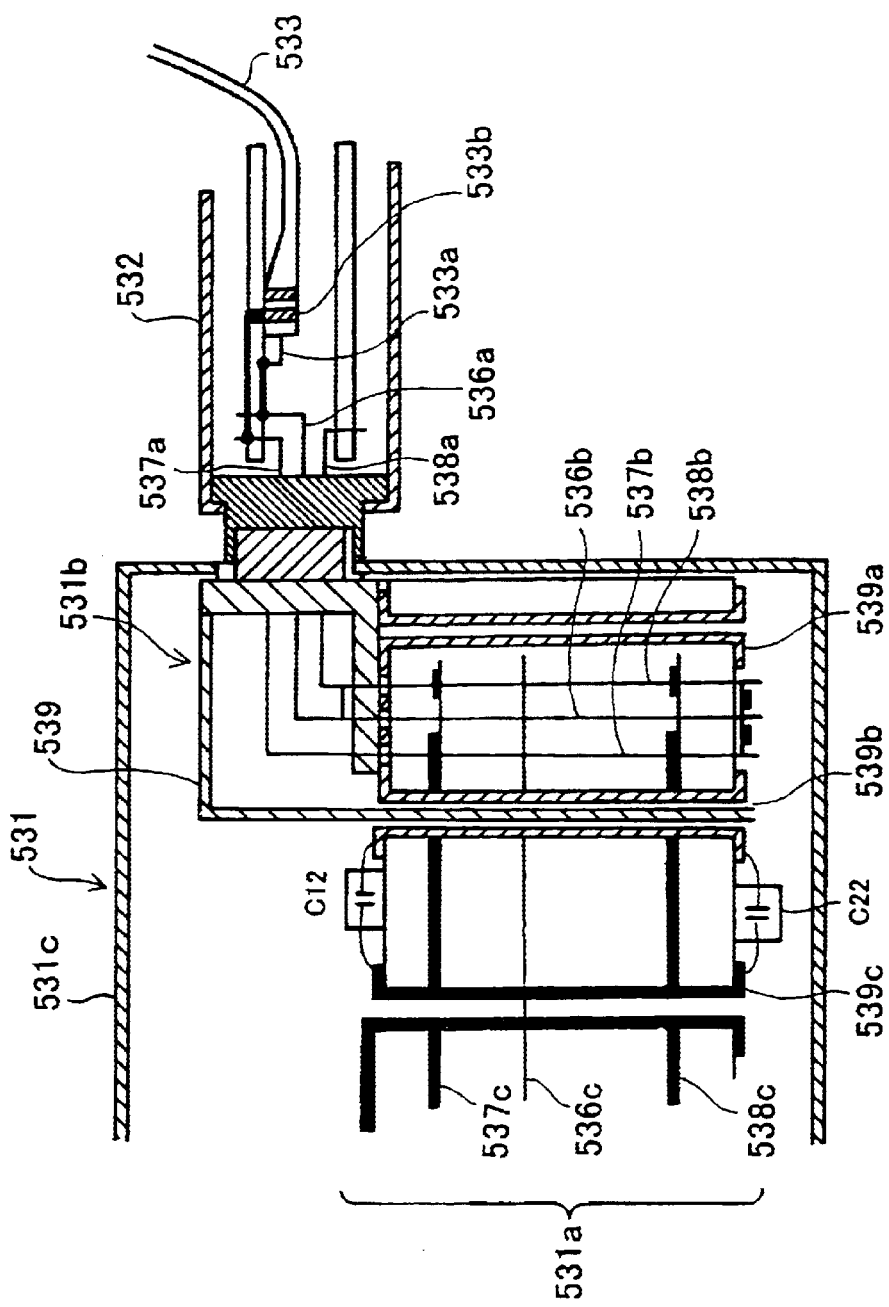
FIG. 22 is a cross-sectional view of the first order-group interface connector.

FIG. 22 shows the first order-group interface connector in cross section. The connector 532 is connected to the external line connector 531b of the connector unit. The conductor 533a of the coaxial cable 533 within the external cable is connected to a signal wire 536a of the connector 532. The sheath 533b of the coaxial cable 533 is connected to a ground wire 537a of the connector 532.

The connector 532 is fitted in the external line connector 531b of the connector unit 531, whereby the signal wire 536a of the connector 532 is connected to a signal wire 536b of the external line connector 531b. The ground wire 537a of the connector 532 is connected to a ground wire 537b of the external line connector 531b. A ground wire 538a of the connector 532 is connected to a ground wire 538b of the external line connector 531b.

The signal wire 536b of the external line connector 531b is connected to a signal wire 536c of the connector board 531a. The ground wire 537b of the external line connector 531b is connected to a ground wire 537c of the connector board 531a. The ground wire 538b of the external line connector 531b is connected to a ground wire 538c of the connector board 531a. The external line connector 531b is connected to a shield case 531c. Further, the shield case 531c is connected to the frame ground (FG).

A metal cover 539 is arranged in a manner covering the wires of the external line connector 531b. On the surface of the connector board 531a, there is formed a frame ground wire 539a. The external line connector 531b is held in contact with the frame ground wire 539a. Further, the connector board 531a is formed with a via hole 539b for the frame ground. On the inner surface of the via hole 539b, there is formed a metal film connected to the frame ground wire. The cover 539 of the external line connector 531b has a portion thereof fitted in the via hole 539b and electrically connected to the inner surface of the via hole 539b e.g. by soldering.

Further, on the connector board 531a, there is formed a signal ground wire 539c. The signal ground wire 539c and the frame ground wire 539a are connected to each other via two coupling capacitors C12, C22 connected in parallel with each other.

Figure 23:
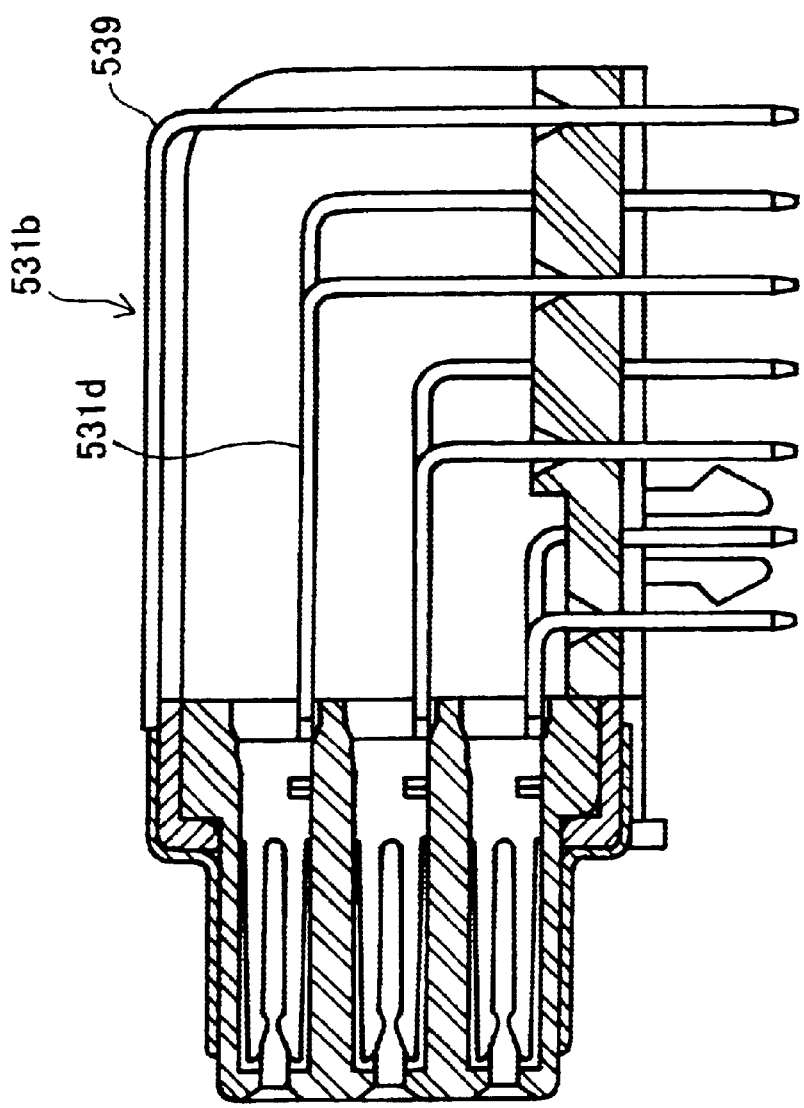
FIG. 23 is an enlarged cross-sectional view of a first order-group interface external line connector.

FIG. 23 is an enlarged cross sectional view of the external line connector for the first order-group interface. As shown in the figure, the external line connector 531b is provided with the cover 539 covering various wires 531d.

In the present embodiment, the sheath of an external cable and the frame ground FG are capacitively coupled with each other as described above, so that it is possible to prevent noise generated in an electronic circuit unit from entering the external cable. Further, since wires within the external line connector is shielded by a cover, shielding of the external line connector is enhanced.

Figure 24:
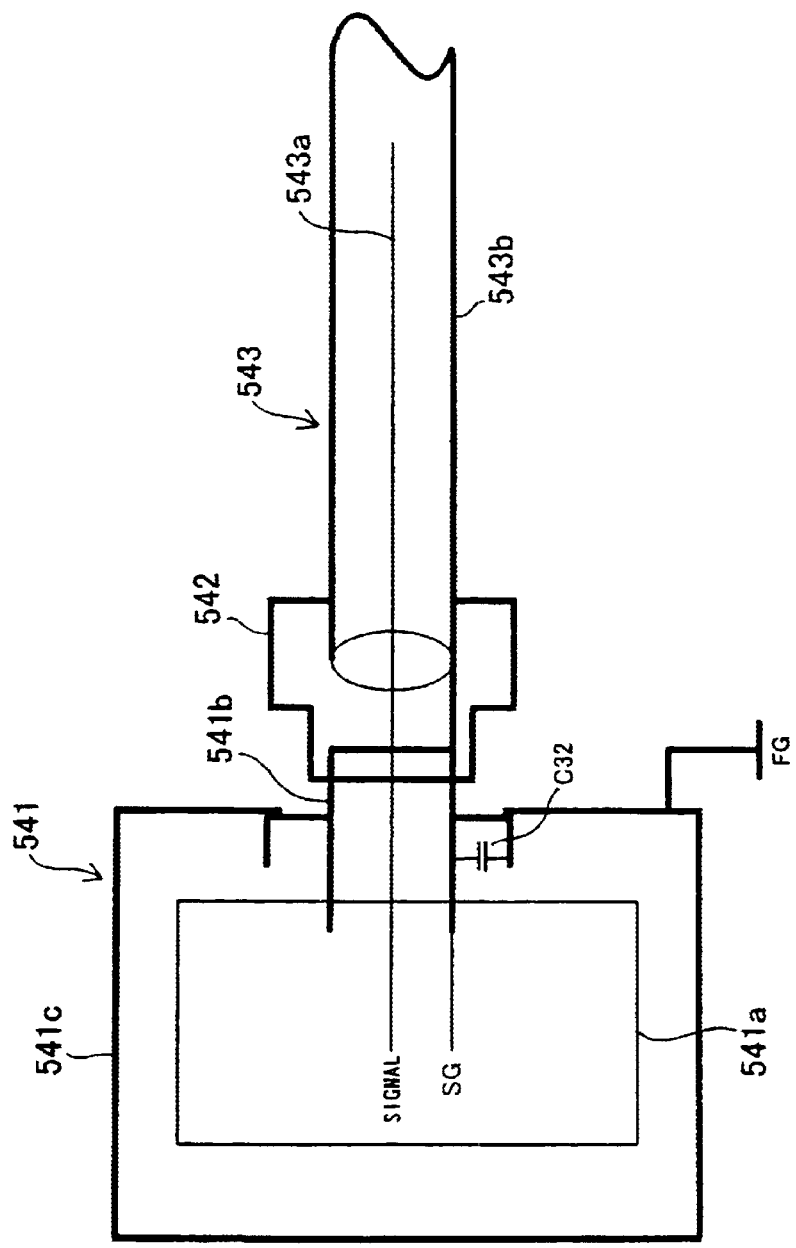
FIG. 24 is a conceptual representation of a third-to-fourth order-group unbalanced shield structure.

FIG. 24 is a conceptual representation of a shield structure of an unbalanced-type connector for the third-to-fourth order-group interface. In the FIG. 24 example, an external cable is connected to an unbalanced-type connector unit 541 for the third-to-fourth order-group interface by a BNC (Bayone Neill Concelman) connector 542. The external cable is formed by a coaxial cable 543. A conductor 543a arranged in the center of the coaxial cable 543 is a signal line connected to a circuit of a connector board 541a. A sheath 543b of the coaxial cable 543 is connected to an external line connector 541b. The external line connector 541b is connected to a shield case 541c via a coupling capacitor C32. Further, the shield case 541c is connected to a frame ground (FG).

Figure 25A:
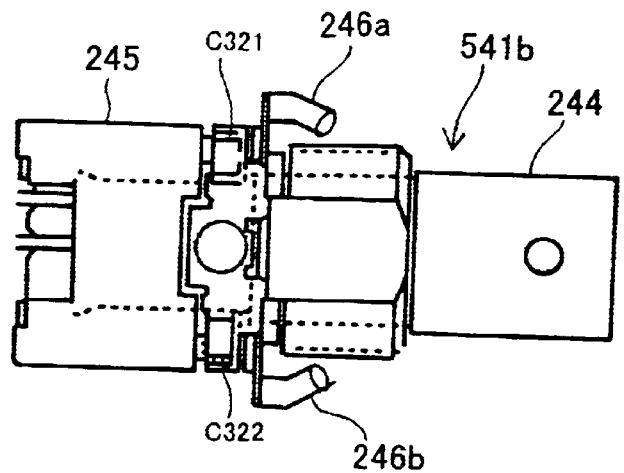
Figure 25B:
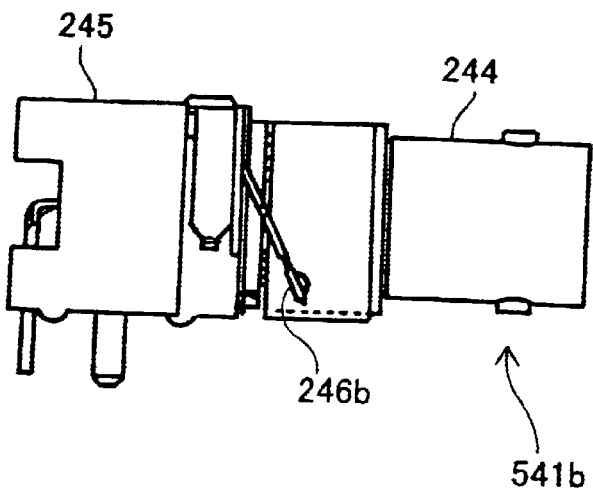

FIGS. 25(A) and 25(B) are enlarged views of an external line connector for the third-to-fourth order-group interface. FIG. 25(A) is a top view, while FIG. 25(B) is a side view.

The third-to-fourth order-group interface external line connector 541b has a cylindrical metal terminal 244 attached to a body 245 thereof. The metal terminal 244 has springs 246a, 246b attached to diametrically opposite sides thereof. The springs 246a, 246b each have a resilient force acting against the front panel on which the external line connector 241b is mounted. The metal terminal 244 is connected to the shield case of a connector unit via a pair of chip capacitors C321, C322.

The sheath 543b of the external line connector 541b formed by a coaxial connector and the frame ground FG are capacitively coupled with each other as described above, so that it is possible to prevent noise generated in an electronic circuit unit from entering the external cable. Further, the coaxial connector incorporates a coupling capacitor.

Figure 26:
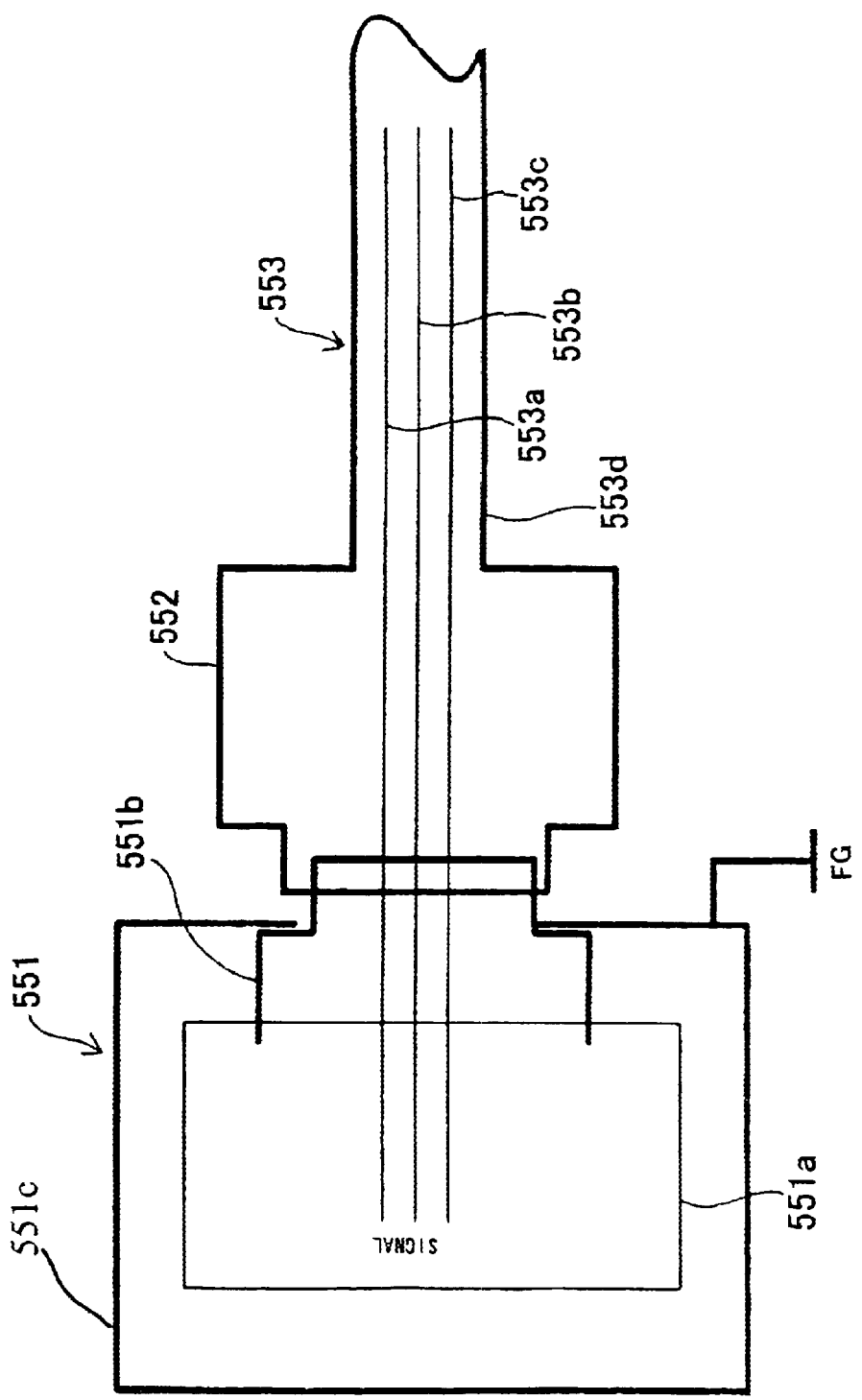
FIG. 26 is a conceptual representation of a first order-group balanced shield structure.

FIG. 26 is a conceptual representation of a shield structure of a balanced-type connector for the first order-group interface. In the FIG. 26 example, an external cable 553 is connected to a balanced-type connector unit 551 for the first order-group interface by a half pitch D-sub connector 552. The external cable 553 contains a plurality of conductors 553a, 553b, 553c. The conductors 553a, 553b, 553c are signal lines connected to a circuit of a connector board 551a. The external cable 553 has a sheath 553d connected to the connector 552. The connector 552 has an outer frame thereof electrically connected to an external line connector 551b. The external line connector 551b is electrically connected to a shield case 551c. Further, the shield case 551c is connected to a frame ground (FG).

Thus, the external line connector 551b is grounded via the shield case 551c as described above, whereby the conductors 553a, 553b, 553c are shielded.

Next, description will be made of a connector unit incorporating a redundantly-configured connector board. Some electronic circuit units in the transmission apparatus are provided with redundancy. For example, two electronic circuit units identical in function are mounted in the transmission apparatus, for redundancy. In this case, one of the electronic circuit units is used as a unit for work (active unit), and the other as a unit for protection (backup unit). The electronic circuit unit for protection starts carrying out processing which has been carried out by the electronic circuit unit for work, e.g. when the latter becomes faulty. To make this possible, it is required that a cable connected to the electronic circuit unit for work is also connected to the electronic circuit unit for protection. In the present embodiment, there is provided a redundantly configured connector unit in a manner corresponding to the redundancy of electronic circuit units.

Figure 27:
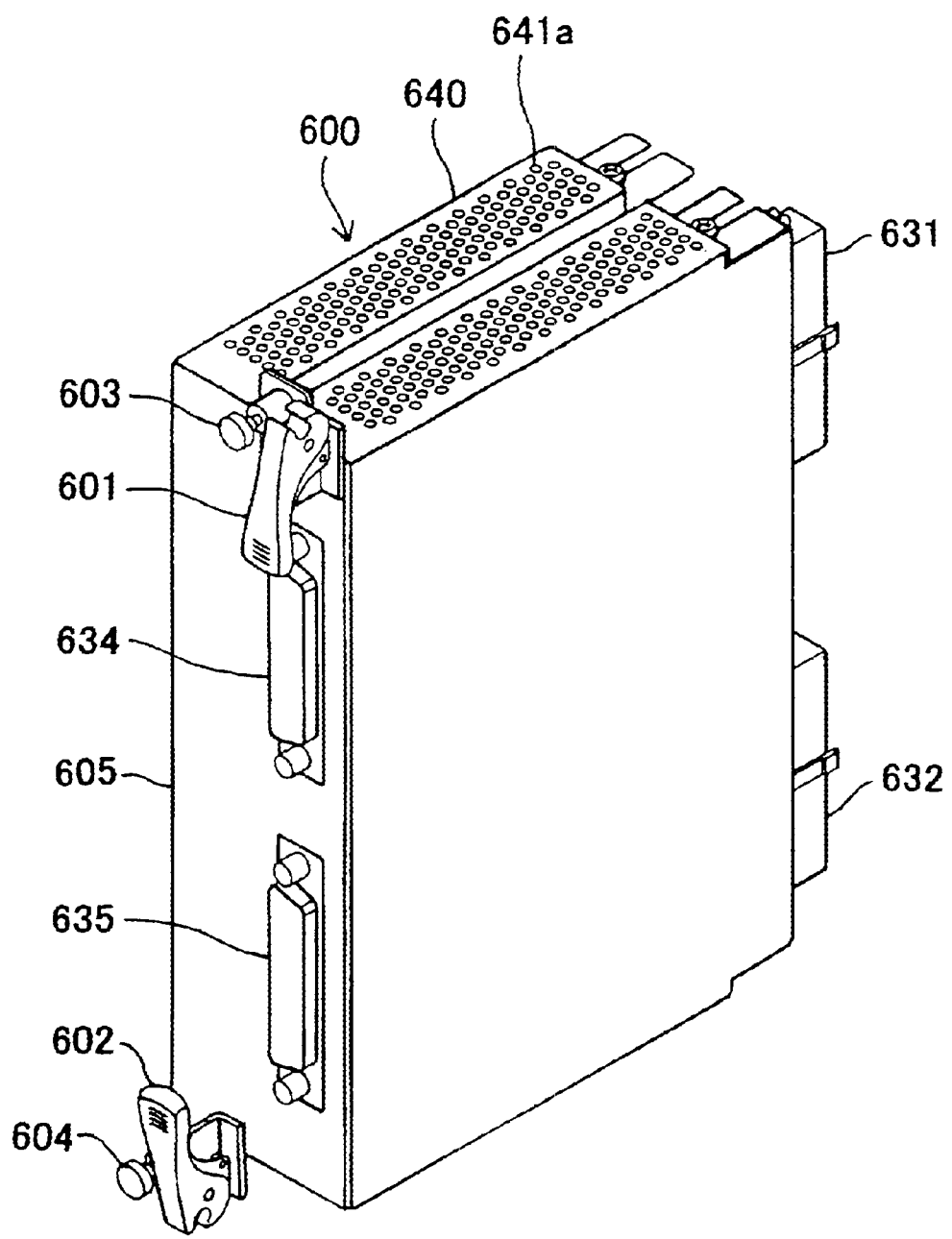
FIG. 27 is a perspective view of a redundantly-configured connector unit.

FIG. 27 shows the redundantly-configured connector unit in perspective. The redundantly-configured connector unit 600 has a metal shield case 640 with a width twice as large as that of a non-redundantly-configured connector unit. The shield case 640 has two insertion levers 601, 602 attached thereto. Immediately beside the insertion levers 601, 602, there are arranged lock screws 603, 604, respectively. Two external line connectors 634, 635 are mounted on a front panel 605. The shield case 640 has an upper wall thereof formed with a plurality of ventilating holes 641*a*. On the rear surface of the connector unit 600, there are mounted male seat connectors 631, 632.

Figure 28:
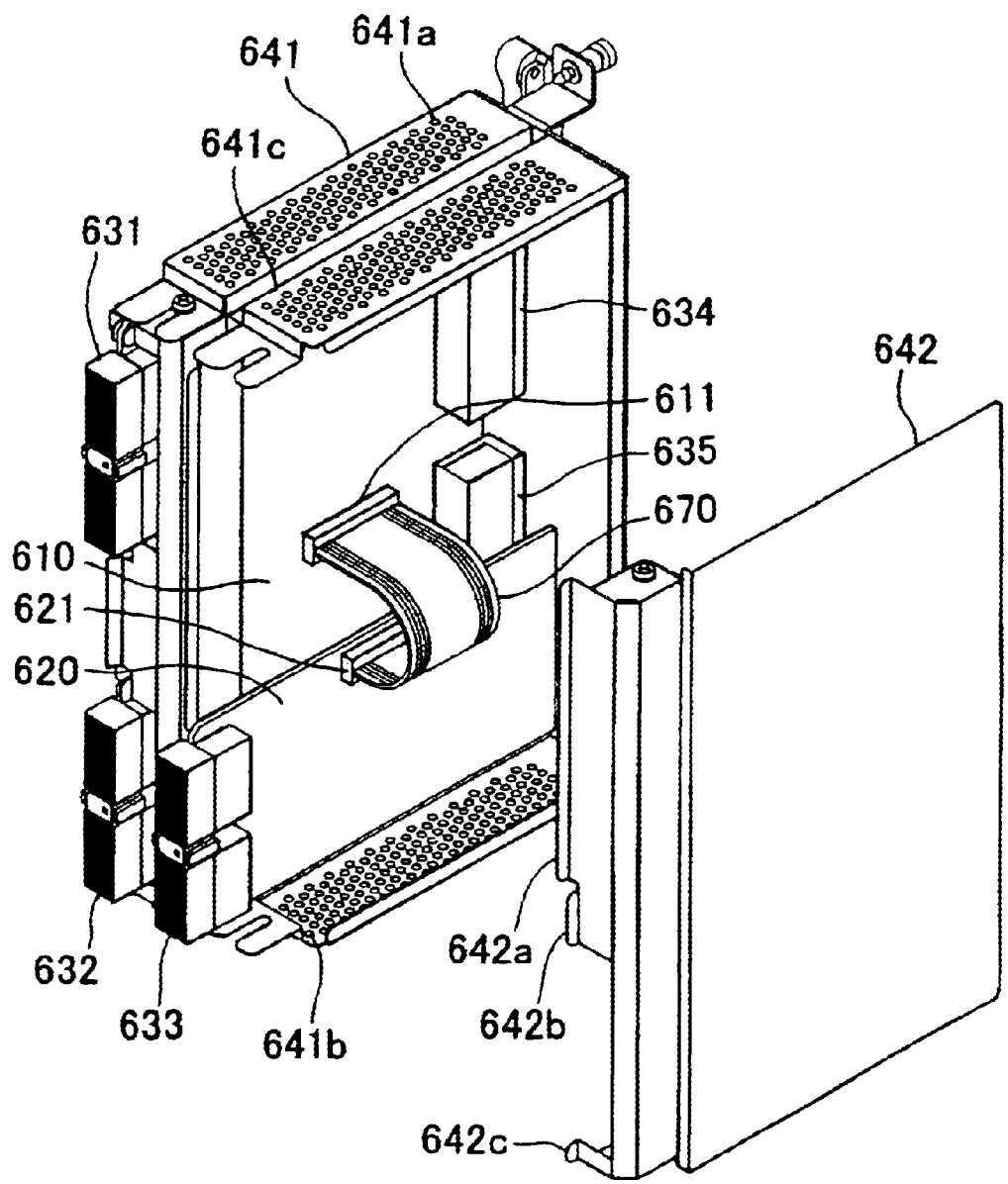
FIG. 28 is an exploded perspective view of the redundantly-configured connector unit.

FIG. 28 is an exploded perspective view of the redundantly-configured connector unit. As shown in the figure, the shield case 640 is comprised of a shield case body 641 having an opening, and a lid mechanism portion 642 which can close the opening. The ends of the shield case body 641 defining the opening is shielded by a shield structure formed similarly to those of the non-redundantly-configured connector units.

The redundantly-configured connector unit 600 has two connector boards 610, 620 housed in the shield case body 641. The connector board 610 is a main board, while the connector board 620 is a sub board. The main connector board 610 has two male seat connectors 631, 632 mounted thereon. Further, external line connectors 634, 635 are mounted on the main connector board 610. On the other hand, the sub connector board 620 has one male seat connector 633 mounted thereon.

The main connector board 610 is provided with a connector 611 for internal connection. The connector 611 is connected to the male seat connectors 631, 632 and the external line connectors 634, 635 by internal wiring of the connector board 610. Similarly, the sub connector board 620 is provided with a connector 621 for internal connection. The connector 621 is connected to the male seat connector 633 by internal wiring of the connector board 620. The connector 611 of the connector board 610 and the connector 621 of the connector board 620 are connected to each other by a flat cable 670. The shield case body 641 has upper and lower walls thereof formed with a plurality of ventilating holes 641*a*, 641*b*, respectively.

Figure 29:
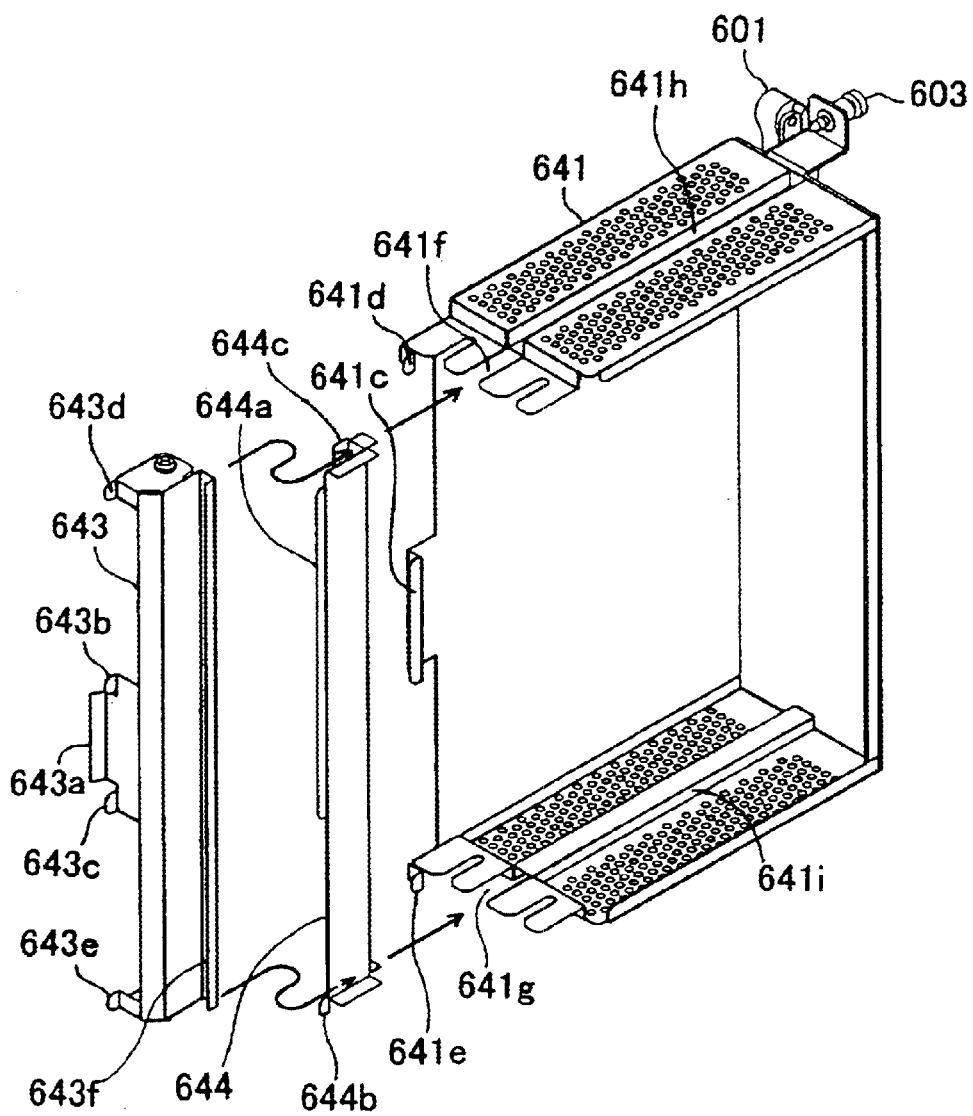
FIG. 29 is a perspective view of a shield case of the redundantly-configured connector unit.

FIG. 29 shows the shield case of the redundantly-configured connector unit in perspective. The shield case 640 has a rear portion formed by two removable frame members 643, 644. The shield case body 641 is formed with a side plate 641*c* for holding the shield case body 641 in contact with the frame member 643. Further, the shield case body 641 is formed with side plates 641*d*, 641*e* serving as stoppers of a floating mechanism of the main connector board 610 for limiting a floatable range of the main connector board 610. On the rear side of the shield case body 641, there are also formed slits 641*f*, 641*g* in which the frame member 644 is fitted. The upper and lower walls of the shield case body 641 are formed thereon with grooves 641*h*, 641*i*, respectively, in a manner corresponding to the respective guide rails of the connector unit-receiving block 160.

The frame member 643 is formed with a side plate 643*a* for abutment with the side plate 641*c* of the shield case body 641. Further, the frame member 643 is formed with side plates 643*b*, 643*c*, 643*d*, 643*e* serving as stoppers of the floating mechanism of the main connector board 610 for limiting the floatable range of the main connector board 610. Still further, the frame member 643 is formed with a U-shaped groove 643*f* for contact with the other frame member 644. The groove 643*f* has a shape which allows a side portion of the shield box 162 of the connector unit-receiving block 160 to be fitted in the groove 643*f*.

The frame member 644 is formed with a side plate 644*a* for contact with the lid mechanism portion 642. Further, the frame member 644 is formed with a side plate 644*b* serving as a stopper of a floating mechanism of the sub connector board 620 for limiting a floatable range of the sub connector board 620. Still further, the frame member 644 is formed with a groove 644*c* in which the groove 643*f* of the frame member 643 is fitted.

In assembling the shield case 640, first, the groove 644*c* of the frame member 644 is fitted in the slits 641*f*, 641*g* of the shield case body 641. Then, the groove 643*f* of the frame member 643 is fitted in the groove 644*c* of the frame member 644, whereby the side plate 643*a* of the frame member 643 is brought into abutment with the side plate 641*c* of the shield case body 641.

Further, when the FIG. 28 lid mechanism portion 642 is mounted, the side plate 642*a* of the lid mechanism portion 642 is brought into abutment with the side plate 644*a* of the frame member 644. In this state, the edges of the lid mechanism portion 642 and the shield case body 641 are held in intimate contact with each other by the shield mechanism provided in the shield case body 641. Side plates 642*b*, 642*c* serve as stoppers of the floating mechanism of connector board 620.

As described above, in the redundantly-configured connector unit of the present embodiment, the two connector boards are housed in the single shield case, and hence the flat cable for connection between the two connector boards can be arranged within the shield case. Thus, although this connector unit is in redundant configuration, a sufficient shielding effect against electromagnetic interference can be ensured.

Further, the redundantly-configured connector unit of the present embodiment has the following advantage. In general, in a redundantly-configured connector unit, it is required to hold two connector boards in a state connected to each other by a cable. Therefore, when a redundantly-configured connector unit is of a double jack type and two connector boards are to be mounted in a subrack separately, it is required to insert the two connector boards alternately little by little to prevent a cable from being detached from one or both of the connector boards. This mounting operation has to be carried out with care, which results in degraded working efficiency. In the present embodiment, since the two connector boards are housed in the single shield case, it is only required to insert the single connector unit incorporating the two connector boards into the subrack, which improves efficiency in operation of mounting the connector unit.

Further, in the embodiment, since the grooves corresponding to the respective guide rails are formed in the respective upper and lower walls of the redundantly-configured connector unit, the connector unit is guided to a proper position simply by being pressed in. This further improves the efficiency of operation of mounting the connector unit.

Moreover, since the groove 643*f* is provided by the frame member 643 mounted on the rear side of the redundantly-configured connector unit 600, when the connector unit 600 is received in the subrack, the metal frame forming the shield of the shield box 162 of the connector unit-receiving block 160 is fitted in the groove 643*f*. Therefore, even when the redundantly-configured connector unit 600 is plugged in, it is possible to obtain the shield effect without any need to change the construction of the connector unit-receiving block 160.

Furthermore, the redundantly-configured connector unit 600 is advantageous in that the two connector boards 610, 620 housed in the shield case 640 each have the male seat connector-side end thereof held off the shield case in a floating state and the external line connector-side end secured to the same. If the connector boards 610, 620 are firmly secured to the shield case 640, when the male seat connectors of the connector boards 610, 620 are fitted in the shield box, there can occur deflection in position at contact portions of the shield case and the shield box, which spoils shielding effects. In the present embodiment, since one end of each connector board is held in the floating state, it is possible to prevent occurrence of such a deflection.

If the amount of deflection of a connector board is excessively large, components installed on the connector board and the shield case can be brought into contact with each other. To prevent this contact, in the present embodiment, the side plates each formed by bending a portion of the shield case are used to limit the amount of deflection of each connector board.

As described above, according to the subrack of the present embodiment, the connector unit-receiving block is arranged on the rear surface of the subrack, for receiving connector units therein, and shielding against electromagnetic interference is performed on a unit-by-unit basis. As a result, even if external cables are increased in number, the shielding effect cannot be degraded, and hence it is possible to comply with an increase in speed of processing within the subrack.

In addition, since it is only required to mount necessary connector units corresponding to respective electronic circuit units, no unnecessary connector is used at all, which contributes to reduction of manufacturing costs of the transmission apparatus housed in the subrack.

Further, it is not required to mount any electronic components on the BWB, which facilitates maintenance of the transmission apparatus. More specifically, electronic components are mounted on electronic circuit units and connector units, and the electronic circuit units and connector units can be easily inserted and removed, so that it is possible to carry out maintenance on the apparatus with ease.

Although in the above embodiment, the connector unit-receiving block has a plurality of shield boxes separately formed for respective slots into each of which a connector unit is plugged, it is possible to integrally form the shield boxes as a one-piece member.

Figure 30:
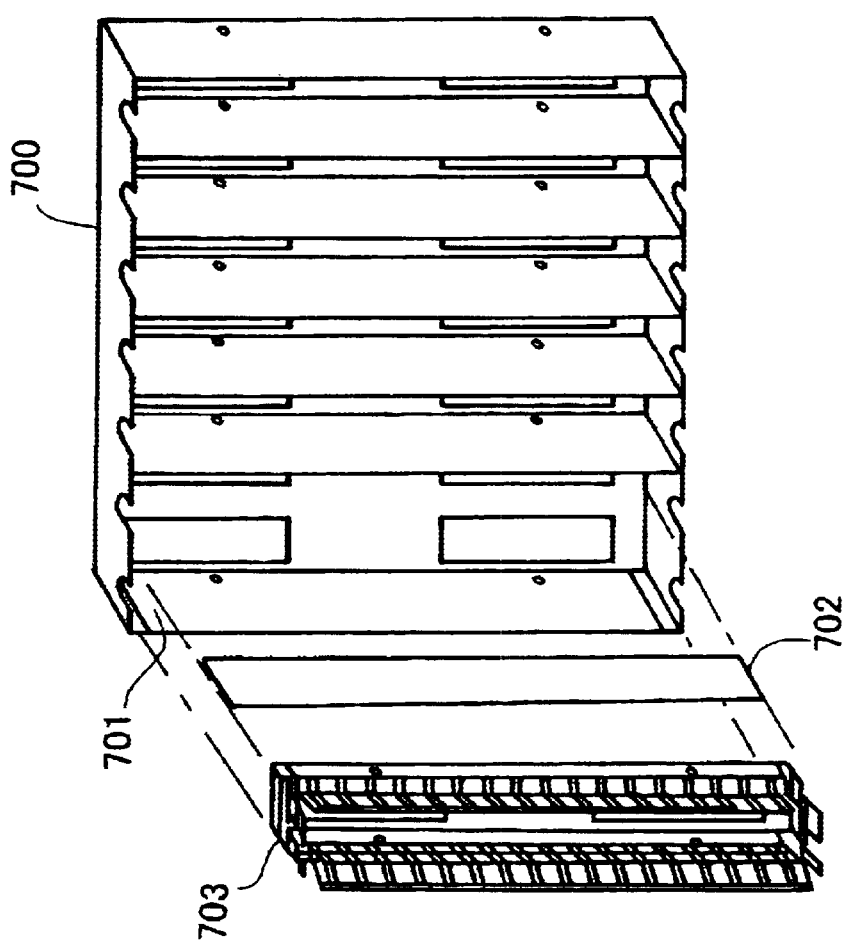
FIG. 30 shows an example of a shield box formed as a one-piece assembly.

FIG. 30 shows an example of such an integrally-formed shield box. The illustrated shield box 700 is formed with a plurality of slots 701 into each of which a connector unit can be fitted. The slots 701 are each separated by a partition 702. Further, each slot 701 incorporates a spring 703 molded in one piece.

In this case, since the shield box and springs each have an integral structure, it is possible to reduce time and labor for assembly of the sub unit as well as to simplify the process of manufacturing the spring.

Next, description will be made of an example of a communication system to which the transmission apparatus of the present embodiment is applied.

Figure 31:
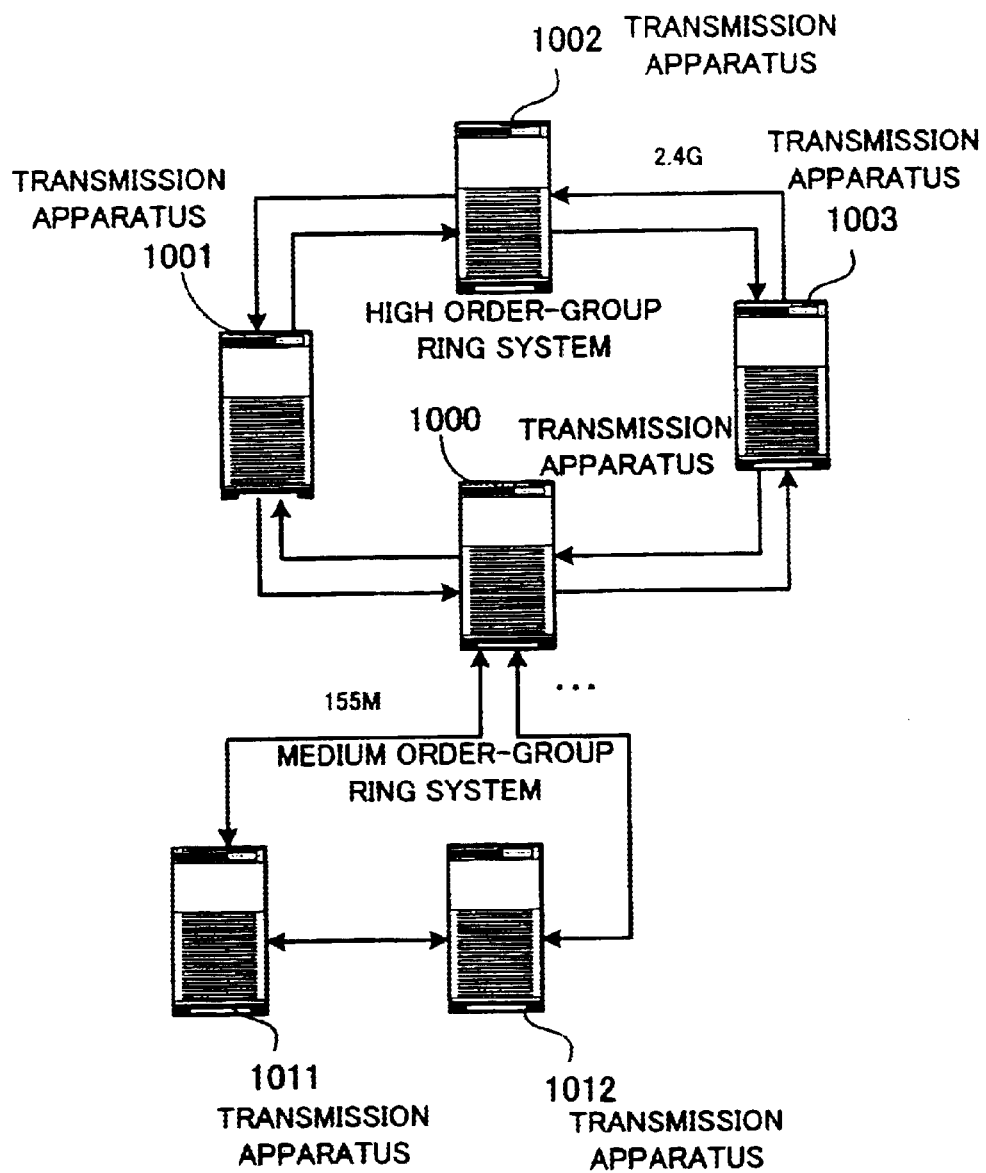
FIG. 31 shows an example of a communication system provided with the transmission apparatuses according to the present embodiment.

FIG. 31 shows the communication system. In the illustrated example, four transmission apparatuses 1000 to 1003 form a ring system which is capable of high-speed transmission. The ring system carries out data transmission e.g. at 2.4 Gbps (bit per second) by using a high order-group interface. The term "high order-group interface" used here means an interface having a transmission rate of e.g. 622 Mbps, 2.4 Gbps or 10 Gbps. In the high order-group interface, data is transmitted by optical signals.

Further, in the FIG. 31 example, the transmission apparatus 1000 and transmission apparatuses 1011, 1012 forms another ring system. The ring system carries out data transmission e.g. at 155 Mbps by a medium order-group interface. The term "medium order-group interface" used here means an interface having a transmission rate of e.g. 34 Mbps, 45 Mbps or 155 Mbps. In the medium order-group interface, data can be transmitted by an optical signal, or alternatively by an electric signal.

Each of the transmission apparatuses in the figure is connected to another ring system, not shown, and each transmission apparatus in the interface ring performs cross-connection of lines and data transmission from a high order-group ring system to a medium order-group (or low order-group) ring system or from a medium order-group (or low order-group) ring system to a high order-group ring system.

Figure 32:
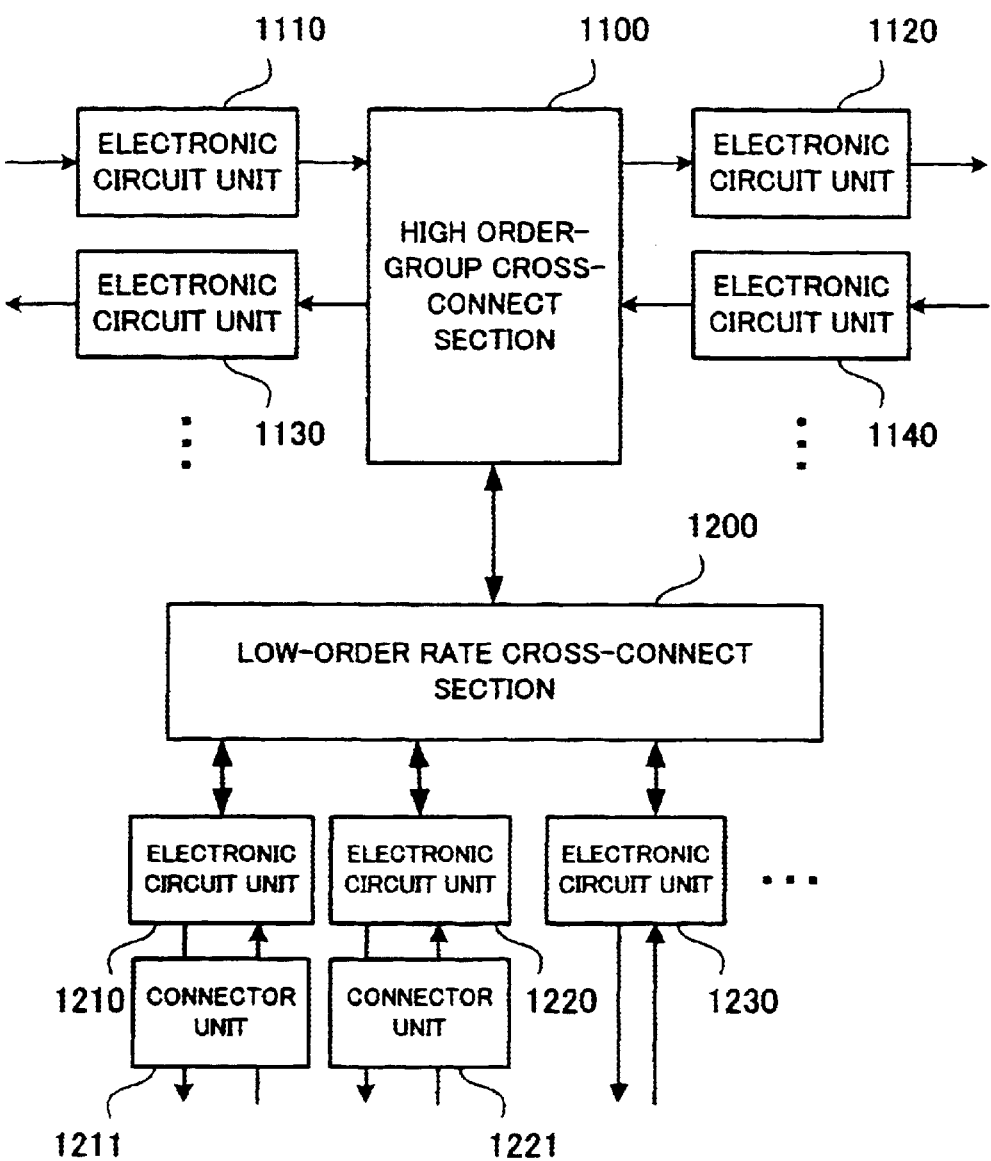
FIG. 32 is a block diagram showing the configuration of the transmission apparatus of the embodiment.

FIG. 32 shows the configuration of the transmission apparatus of the present embodiment. It should be noted that in the figure, only components directly related to data transmission are shown, and a control unit for controlling the whole transmission apparatus etc. are omitted. The transmission apparatus includes a high order-group cross-connect section 1100 for cross-connection of high order-group interfaces and a low order-group cross-connect section 1200 for cross-connection of medium to low order-group interfaces.

Connected to the high order-group cross-connect section 1100 are a plurality of electronic circuit units 1110, 1120, 1130, 1140. The electronic circuit units 1110, 1140 receive data transmitted from external devices e.g. at a transmission rate of 2.4 Gbps or 10 Gbps and input the data into the high order-group cross-connect section 1100. The high order-group cross-connect section 1100 transfers data received from the electronic circuit unit 1110 or 1140 or the low order-group cross-connect section 1200, to the electronic circuit unit 1120 or 1130 or the low order-group cross-connect section 1200.

Connected to the low order-group cross-connect section 1200 are a plurality of electronic circuit units 1210, 1220, 1230. The electronic circuit units 1210, 1220, 1230 each send and receive data e.g. at 155 Mbps or 45 Mbps via metallic cables or optical fiber cables. The electronic circuit units 1210, 1220, 1230 input received data to the low order-group cross-connect section 1200 and output data sent from the low order-group cross-connect section 1200 to an external device. The electronic circuit units 1210, 1220 use metallic cables for data transmission, while the electronic circuit unit 1230 uses an optical fiber cable. The low order-group cross-connect section 1200 transfers data received from the electronic circuit unit 1210, 1220 or 1230 or the high order-group cross-connect section 1100 to the electronic circuit unit 1210, 1220 or 1230 or the high order-group cross-connect section 1100.

Connector units 1211, 1221 are connected to the electronic circuit units 1210, 1220, respectively. The electronic circuit unit 1230 using the optical fiber cable for data transmission does not use a connector unit of the embodiment.

As described above, in the transmission apparatus of the present embodiment, a connector unit is used only when data is transmitted by a metallic cable. The reason for this is that the use of an optical fiber cable ensures a sufficient shielding effect against electromagnetic interference even when the optical fiber cable is connected to the front of an electronic circuit unit.

It should be noted that although the connector units 1211, 1221 are connected to the respective electronic circuit units 1210, 1220 appearing in FIG. 32 in a one-to-one correspondence, when a redundant configuration is employed, one connector unit is connected to two electronic circuit units.

Figure 33:
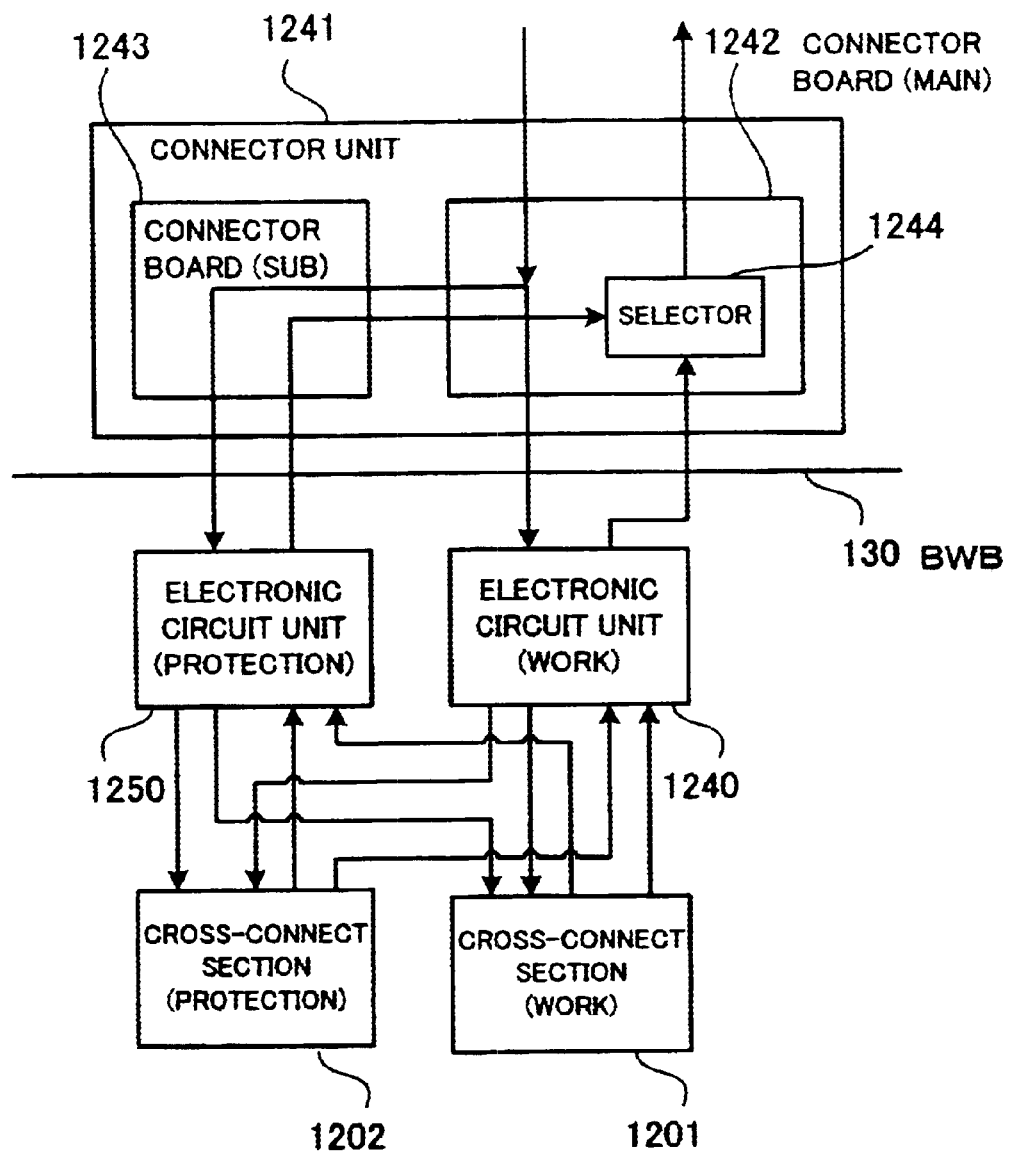
FIG. 33 is a block diagram showing the configuration of a redundantly-configured data transmission system.
Figure 34:
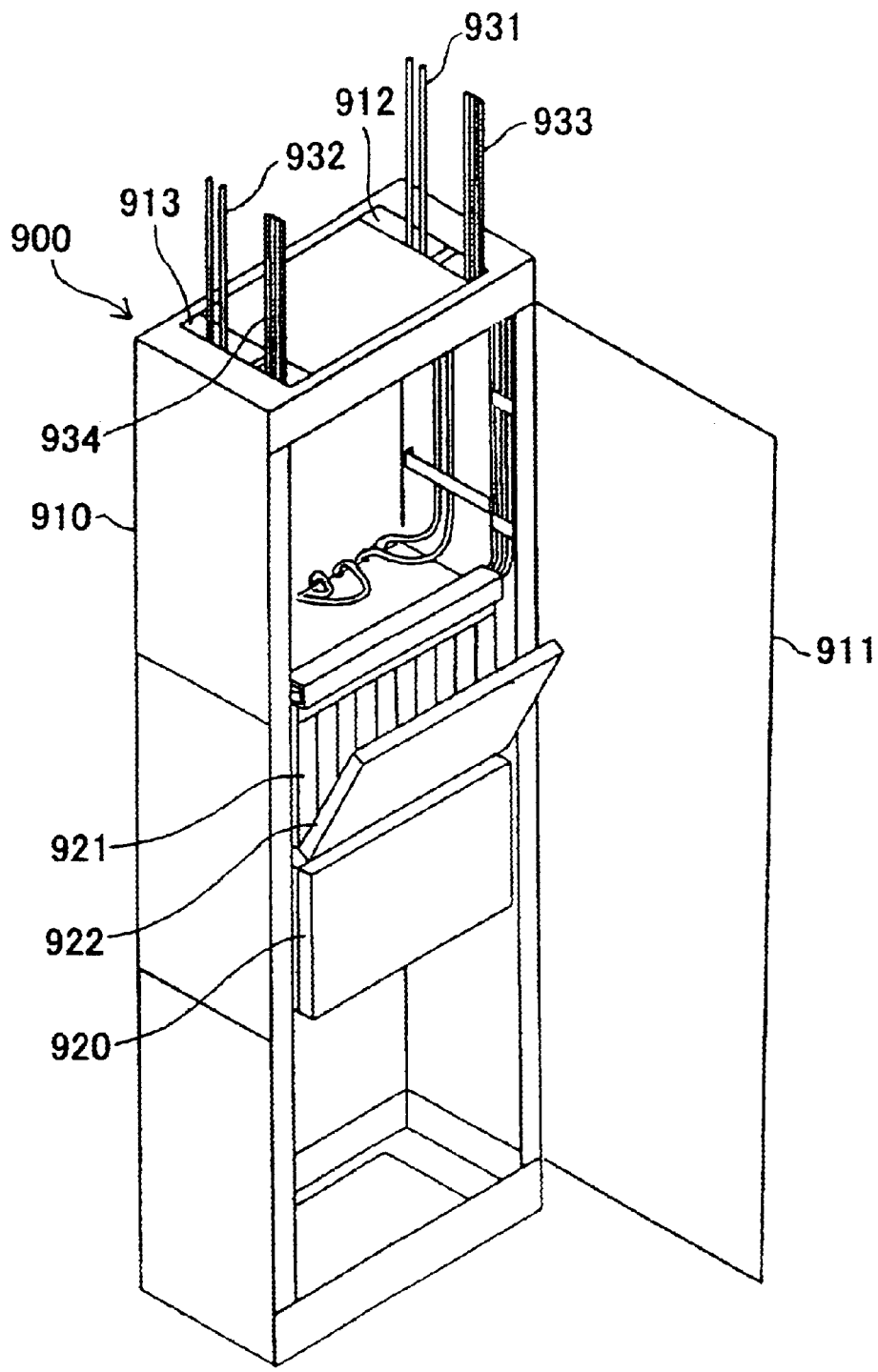
FIG. 34 shows the appearance of a conventional transmission apparatus.

FIG. 33 shows a redundantly-configured data transmission system. In the redundancy configuration, the system is provided with a cross-connect section 1201 for normal operation (work) and a cross-connect section 1202 for protection. In FIG. 33, a high order-group cross-connect section and a low order-group cross-connect section are not separated.

An electronic circuit unit 1240 for work and an electronic circuit unit 1250 for protection are connected to the cross-connects 1201, 1202, respectively. A connector unit 1241 is connected to the two electronic circuit units 1240, 1250 via a BWB 130. The connector unit 1241 incorporates a connector board 1242 for work and a sub connector board 1243. The connector board 1242 for work is connected to the electronic circuit unit 1240 for work, while the sub connector board 1243 is connected to the electronic circuit unit 1250 for protection. The connector board 1242 for work and the electronic circuit unit 1250 for protection are connected to each other within the connector unit 1241.

The connector board 1242 for work includes a selector 1244. The selector 1244 is capable of selecting one of the electronic circuit unit 1240 for work and the electronic circuit unit 1250 for protection and delivering a signal outputted from the selected one. The cross-connect section 1201 for work and the cross-connect section 1202 for protection have the same function. As long as the cross-connect section 1201 for work is operating normally, it carries out processing, such as data distribution. When the cross-connect section 1201 for work cannot operate normally e.g. due to a failure, the cross-connect section 1202 for protection takes over the processing to be executed by the cross-connect section 1201.

In the redundant configuration described as above, as long as each component is operating normally, the selector 1244 selects the electronic circuit unit 1240 for work as a source of data output. Therefore, data transferred to the electronic circuit unit 1240 from the cross-connect section 1201 for work is delivered to an external device via the connector unit 1241. On the other hand, data received from an external device is sent to the two electronic circuit units 1240, 1250. Then, the data is delivered to the two cross-connects 1201, 1202 from the respective electronic circuit units 1240, 1250.

At this time, if the electronic circuit unit 1240 for work is faulty, the selector 1244 detects that the electronic circuit unit 1240 is not operating normally. As a result, the selector 1244 switches the output source of the data from the electronic circuit unit 1240 to the electronic circuit unit 1250 for protection. Consequently, the data transferred to the electronic circuit unit 1250 from the cross-connect section 1201 is delivered to the external device via the connector unit 1241. Although data received from the external device is transferred to the two electronic circuit units 1240, 1250, since the electronic circuit unit 1240 is faulty, the data is sent to the two cross-connects 1201, 1202 only from the electronic circuit unit 1250 for protection.

In the above example, the selector is incorporated in the connector board for work, and hence it is not required to use a slot exclusively for a selector. As a result, the number of slots for use can be reduced, which makes it possible to decrease the number of slots in the connector unit-receiving block, thereby reducing the width of the subrack.

In the present embodiment, as described above, connector boards each having an external line connector mounted thereon are arranged on the rear surface of the back wiring board having electronic circuit units mounted on the front surface thereof, and each connector board is covered by a metal case. As a result, since shielding against electromagnetic interference is achieved at an portion where each electronic circuit unit and a corresponding external cable are connected, excellent EMC performances can be maintained even if external cables connected thereto are increased in number.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A transmission apparatus including a plurality of communication interfaces, comprising:
   a subrack including:
      a back wiring board,
      a first connector arranged on a front surface of the back wiring board,
      a second connector arranged on a rear surface of the back wiring board and electrically connected to the first connector, and
      a metal connector unit-receiving block arranged on the rear surface of the back wiring board and having a space formed therein, for receiving a plurality of said connector units;
   an electronic circuit unit connected to the first connector on the back wiring board; and
   a connector unit including a connector board on which are mounted a male seat connector connected to the second connector on the back wiring board and an external line connector electrically connected to the male seat connector, and a metal case for covering the connector board;
   wherein the connector unit-receiving block of the subrack further includes a plurality of metal boxes in each of which said connector unit is fitted, and metal springs each secured within a corresponding one of the boxes and having a resilient force acting in a direction of holding said connector unit fitted in the box,
   wherein said connector unit is received in said connector unit-receiving block in a manner fitted in the box within said connector unit-receiving block, and
   wherein within said connector unit, at least one of ends of the connector board is held off the case, in a floating state, laterally movable between opposing side plates inwardly protruded with respect to an interior of the case.

2. The transmission apparatus according to claim 1, wherein the connector unit-receiving block has a plurality of the boxes integrally formed as a one-piece member.

3. The transmission apparatus according to claim 1, wherein the connector unit-receiving block has an integrally-formed spring in contact with all inner surfaces of each of the boxes.

4. The transmission apparatus according to claim 1, wherein the end of the connector board held off the case, in the floating state is an end on which the male seat connector is mounted.

5. The transmission apparatus according to claim 1, wherein the case of said connector unit comprises a case body formed with an opening and housing the connector board and a lid mechanism portion which can be removably mounted in a position for closing the opening of the case body.

6. The transmission apparatus according to claim 5, wherein within said connector unit, at least one of ends of the connector board is held off the case in a floating state, and wherein the case body of the case and the lid mechanism portion of the case each have side plates formed in a manner enclosing the end of the connector board held off the case in the floating state, the side plates of the case body and the side plates of the lid mechanism portion being in agreement with each other.

7. The transmission apparatus according to claim 5, wherein ends of the case body defining the opening are each provided with a spring having a resilient force acting in a direction of holding the lid mechanism portion in a sandwiched manner between the spring and the case body.

8. A subrack that is capable of housing a plurality of communication interfaces, comprising:

a back wiring board;

an electronic circuit unit-receiving block arranged on a front surface of said back wiring board, for receiving an electronic circuit unit;

a first connector provided in said electronic circuit unit-receiving block, for connection with said electronic circuit unit;

a connector unit-receiving block arranged on a rear surface of said back wiring board, for receiving a connector unit including a connector board on which are mounted a male seat connector and an external line connector electrically connected to the male seat connector, and a metal case for covering the connector board; and a second connector provided in said connector unit-receiving block, for electrical connection with said first connector and connectable with the male seat connector of the connector board;

wherein said connector unit-receiving block further includes a plurality of metal boxes in each of which the connector unit is fitted, and metal springs each secured within a corresponding one of the boxes and having a resilient force acting in a direction of holding said connector unit fitted in the box, and wherein within said connector unit, at least one of ends of the connector board is held off the case, in a floating state; and wherein said connector unit-receiving block has an integrally-formed spring in contact with all inner surfaces of each of the boxes.

9. A connector unit for electrically connecting between an electronic circuit unit having a communication interface function and an external cable, the connector unit comprising:

a connector board on which are mounted a male seat connector connectable to a connector provided in a subrack which is capable of housing the electronic circuit board and an external line connector electrically connected to the male seat connector; and a metal case for covering said connector board;

wherein an end of the connector board is held off said case, in a floating state, laterally movable between opposing side plates inwardly protruded with respect to an interior of the case, and wherein a case body of said case and a lid mechanism portion of said case each have side plates formed in a manner enclosing the end of the connector board held off said case in the floating state, the side plates of the case body and the side plates of the lid mechanism portion being in agreement with each other; and wherein the end of the connector board held off said case, in the floating state is an end on which the male seat connector is mounted.

10. The connector unit according to claim 9, wherein said case comprises a case body formed with an opening and housing said connector board, and a lid mechanism portion which can be removably mounted in a position for closing the opening of the case body.

11. The connector unit according to claim 10, wherein ends of the case body defining the opening are each provided wit a spring having a resilient force acting in a direction of holding the lid mechanism portion in a sandwiched manner between the spring and the case body.

* * * * *